United States Patent [19]

Takeda et al.

[11] Patent Number: 4,739,304
[45] Date of Patent: Apr. 19, 1988

[54] DIGITAL-TO-ANALOG CONVERTING SYSTEM

[75] Inventors: Masashi Takeda; Ikuro Hata; Masayuki Katakura, all of Kanagawa; Norio Shoji, Tokyo, all of Japan

[73] Assignee: Sony Corporation, Tokyo, Japan

[21] Appl. No.: 917,308

[22] Filed: Oct. 10, 1986

Related U.S. Application Data

[63] Continuation of Ser. No. 663,147, Oct. 22, 1984, abandoned.

[30] Foreign Application Priority Data

Oct. 25, 1983 [JP] Japan ................................ 58-199576
Oct. 25, 1983 [JP] Japan ................................ 58-199577
Nov. 7, 1983 [JP] Japan ................................ 58-208878

[51] Int. Cl.$^4$ ........................ H03M 1/68; H03M 1/82
[52] U.S. Cl. ........................ 340/347 DA; 340/347 CC; 340/347 M
[58] Field of Search ................. 340/347 DA, 347 CC, 340/347 M

[56] References Cited

U.S. PATENT DOCUMENTS

| | | | |
|---|---|---|---|
| 3,754,233 | 8/1973 | Sutherland | 340/347 DA |
| 3,893,102 | 7/1975 | Candy | 340/347 DA |
| 4,369,432 | 1/1983 | Mikami | 340/347 M X |
| 4,536,743 | 8/1985 | Uchikoshi | 340/347 DA |
| 4,542,371 | 9/1985 | Uchikoshi | 340/347 DA |
| 4,567,468 | 1/1986 | Tanaka | 340/347 DA |

OTHER PUBLICATIONS

Schmid, Electronic Analog/Digital Conversions, Van Nostrand Reinhold Company, 1970, pp. 168–175; 206–213.

*Primary Examiner*—T. J. Sloyan
*Attorney, Agent, or Firm*—Lewis H. Eslinger; Alvin Sinderbrand

[57] ABSTRACT

A digital-to-analog convertor divides an input digital signal into a least significant bit group and a most significant bit group. The most significant bit group is converted using pulse amplitude modulation and the least significant bit group is converted using pulse width modulation, in which the pulse widths are varied symmetrically about predetermined time points within a conversion period in order to improve the linearity of the pulse width modulation conversion.

8 Claims, 18 Drawing Sheets

DIGITAL-TO-ANALOG CONVERTING SYSTEM

This is a continuation of application Ser. No. 06/663,147, filed 10-22-84, now abandoned.

BACKGROUND OF THE INVENTION

1. Field of the Invention

This invention relates to a digital-to-analog converting syste employed in various digital processing systems such as PCM (Pulse-Code Modulation) record players. More particularly, the invention concerns a digital-to-analog converting system, which can digital-to analog convert Pulse Amplitude Modulation (PAM) waves and Pulse Width Modulation (PWM) waves.

2. Description of the Prior art

Heretofore, digital-to-analog (D/A) converting systems, which can convert a digital signal with each bit having a fixed weight, e.g., simple binary codes and binarized decimal codes, into an analog signal, are well known in the art. These digital-to-analog converting systems include one, in which the digital signal noted above is converted to a PAM or PWM wave corresponding to digital data given by the weight of each bit and the PAM or PWM wave thus obtained is interpolated through a low-pass filter to obtain the analog signal.

With a D/A converting system which is based on a system of converting a digital signal to a PAM wave (hereinafter referred to as PAM system), principally a conversion characteristic having satisfactory linearity can be obtained. This D/A converting system, however, requires highly precise resistance adder and current adder accurately corresponding to the weight of each bit of the input digital signal. If the resolution is to be increased, therefore, increase of the circuit scale is inevitable, and also the entire circuit must be constructed with a high precision. With a D/A converting system which is based on a system of converting a digital signal to a PWM wave (hereinafter referred to as PWM system), the output pulse width may be controlled by a counter according to the input digital signal, so that the circuit construction that is required is simple. However, the conversion characteristic is principally non-linear and involves conversion errors. Also, it is necessary to increase the operation frequency of the counter according to the resolution.

FIG. 1 shows analog signals obtained through the PAM system conversion and analog signals obtained through the PWM system conversion. As is seen from the Figure, the PAM pulses and PWM pulses that are produced from digital signal by respective systems have equal areas. With the PWM pulses, with which the duty ratio with respect to the conversion period T varies, unlike the PAM pulses with which the duty ratio remains fixed, the linearity of analog signal that is obtained by smoothing the pulses through a predetermined low-pass filter is deteriorated.

More particularly, the digital-to-analog conversion characteristic of the PWM system is not linear but is gently curved as shown in FIG. 2. The non-linearity of the PWM system conversion characteristic varies according to the frequency of the analog signal obtained. The distortion due to the non-linearity is increased with increasing analog signal frequency and also with increasing maximum PWM wave pulse width in one conversion period T.

The distortion due to conversion in the PWM system noted above may be reduced by increasing the operation frequency of a counter that controls the pulse width of the PWM wave and thereby reducing the pulse width of the PWM wave representing one LSB of data. By reducing the pulse width of one LSB, however, the signal level of the analog signal that is obtained through interpolation of the PWM wave through a low-pass filter is reduced to reduce the ratio between the maximum output level and zero signal level, i.e., the dynamic range of signal.

In case where D/A conversion with a resolution of N bits is performed by the PWM system, the pulse width $\tau_0$ representing one LSB of PWM pulses where the maximum pulse width is $\tau_{max}$ is given as $$\tau_0 = \frac{\tau_{max}}{2^N - 1} \quad (1)$$

Where a 16-bit PCM audio D/A converter is employed, for instance, with a maximum pulse width $\tau_{max}$ of 10 μsec., i.e., approximately one-half of a sampling period of 22 μsec., the pulse width $\tau_0$ representing one LSB has to be $$\tau_0 = \frac{10 \ \mu sec}{2^{16} - 1}$$

$$= 0.15 \ nsec.$$

In order to control the pulse width of the PWM pulses in this case with a counter, it is necessary to operate the counter at a clock frequency $f_{CLK}$ of $$f_{CLK} = \frac{1}{\tau_0}$$

$$\approx 6600 \ MHz$$

However, even with an ordinary high speed counter based on ECL (Emitter-Coupled Logic), the practical upper limit of the operation frequency is of the order of 100 MHz. Therefore, it has been very difficult to realize a high resolution D/A converting system based on the PWM system.

When D/A conversion with a resolution of N bits is to be realized with a PAM system employing current adders, for instance, N current sources which are provided with highly precise weights are required for each bit.

SUMMARY OF THE INVENTION

There is provided a digital-to-analog converting system according to the present invention, in which N-bit input digital data is divided into at least $n_H$ higher order bits and $n_L$ lower order bits, the $n_H$ higher order bit data are converted to Pulse Amplitude Modulation wave, the $n_L$ lower order bit data are converted to Pulse Width Modulation wave, and the PAM and PWM waves thus obtained are added together in a timed relation to each other to obtain an output.

An object of the present invention is to provide a digital-to-analog converting system, which can solve the problems discussed above with a novel structure which makes effective use of the merits of both the PWM and PAM systems to obtain a high resolution of D/A conversion.

Another object of the present invention is to permit D/A conversion on the basis of the PWM system with a reduction of the operation frequency of the PWM wave pulse width control counter to a practical frequency.

A further object of the present invention is to improve the linearity of the D/A conversion characteristic by reducing the conversion error due to the PWM system, thereby ensuring a broad dynamic range and reducing the distortion of the analog signal to be obtained without deterioration of the distortion factor of the output analog signal.

The above-mentioned and other objects and features of the invention will become apparent from the following detailed description taken in conjunction with the drawings which indicate embodiments of the invention.

DESCRIPTION OF THE PREFERRED EMBODIMENTS

Now, one embodiment of the digital-to-analog converting system according to the present invention will be described in detail.

Figure 1:
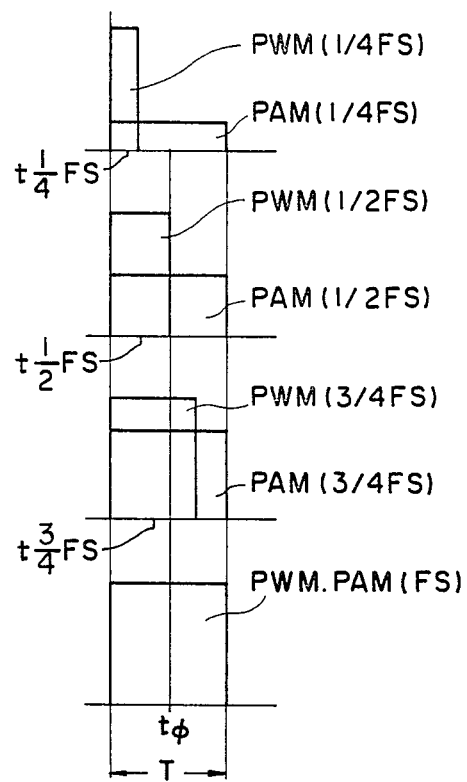
FIG. 1 is a waveform diagram showing PAM and PWM waves usually used for D/A conversion.
Figure 2:
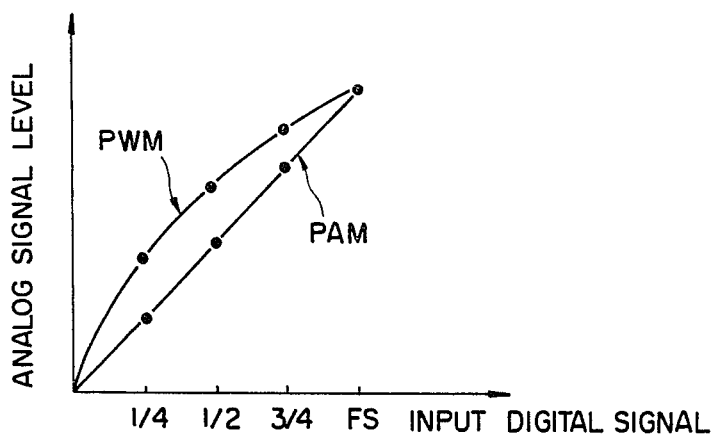
FIG. 2 is a graph showing conversion characteristics of D/A conversion using PAM and PWM waves, respectively.
Figure 3:
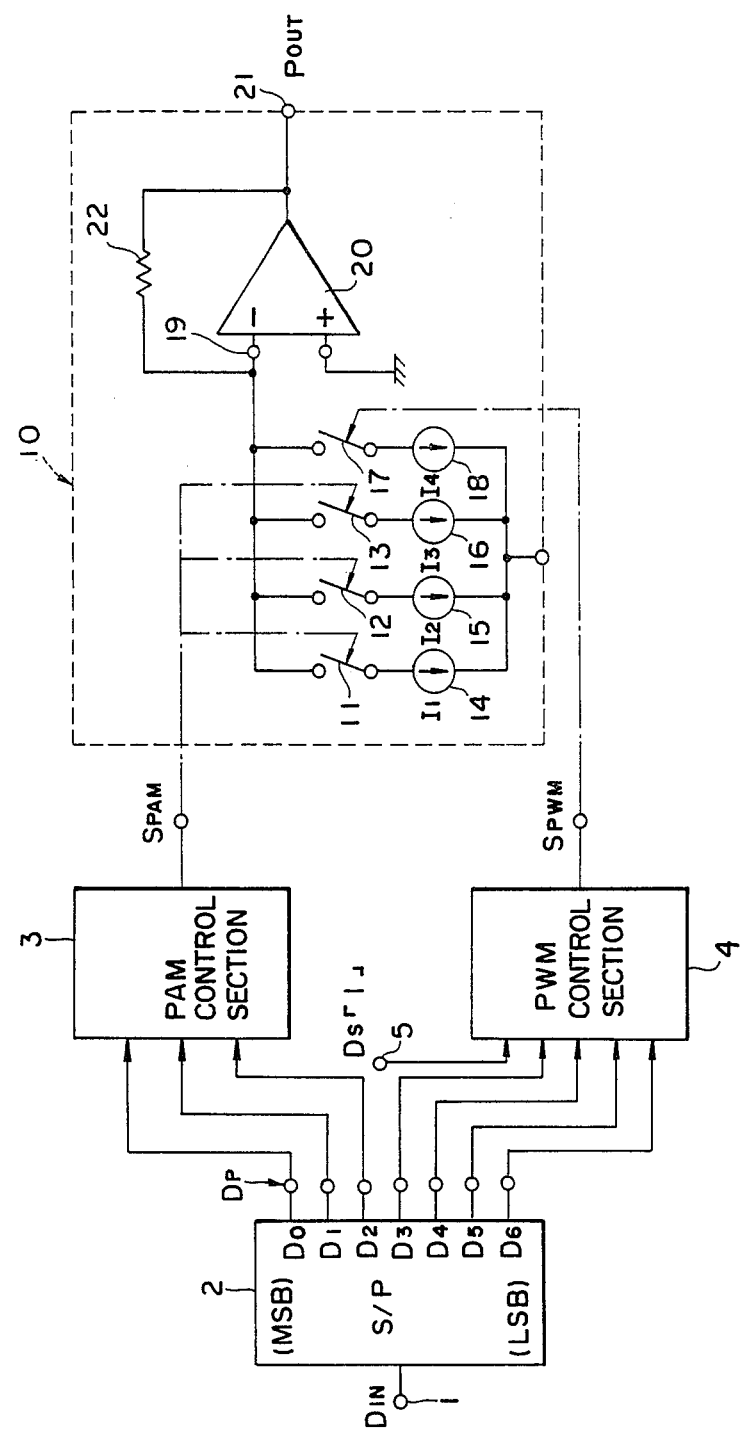
FIG. 3 is a schematic representation of a first embodiment of the digital-to-analog converting system according to the present invention.

A first embodiment of the present invention is shown in the block diagram of FIG. 3. N-bit serial data $D_{IN}$ which is obtained through quantization of an analog signal for every sampling period $T_S$, is supplied to a data input terminal 1. In this embodiment, 7-bit data is supplied as the serial data $D_{IN}$ to the data input terminal 1.

This serial data DIN is supplied from the data input terminal 1 to a serial-to-parallel (S/P) converter 2 for conversion to parallel data $D_P$.

The N-bit (i.e., 7-bit) parallel data $D_P$ consisting of bits $D_0$ to $D_6$ obtained from the S/P converter 2, is divided into MSB side $n_H$-bit (i.e., 3-bit) data $D_H$ consisting of higher order bits $D_0$ to $D_2$ with greater weights and LSB side $n_L$-bit (i.e., 4-bit) data $D_L$ consisting of lower order bits $D_3$ to $D_6$ with smaller weights. The higher order $n_H$-bit data $D_H$ is supplied to a PAM control section 3, while the lower order $n_L$-bit data $D_L$ is supplied to a PWM control section 4.

In this embodiment, the PWM control section 4 is supplied with one-bit data $D_S$ of logic level "1" supplied to a secondary data input terminal 5. It adds the one-bit data $D_S$ to the higher order bit $D_S$ side of the lower order bit data $D_L$ to obtain 5-bit data $D_F$ consisting of bits $D_S$ and $D_3$ to $D_6$, and decodes this data to obtain a laterally symmetrical PWM wave.

Figure 4:
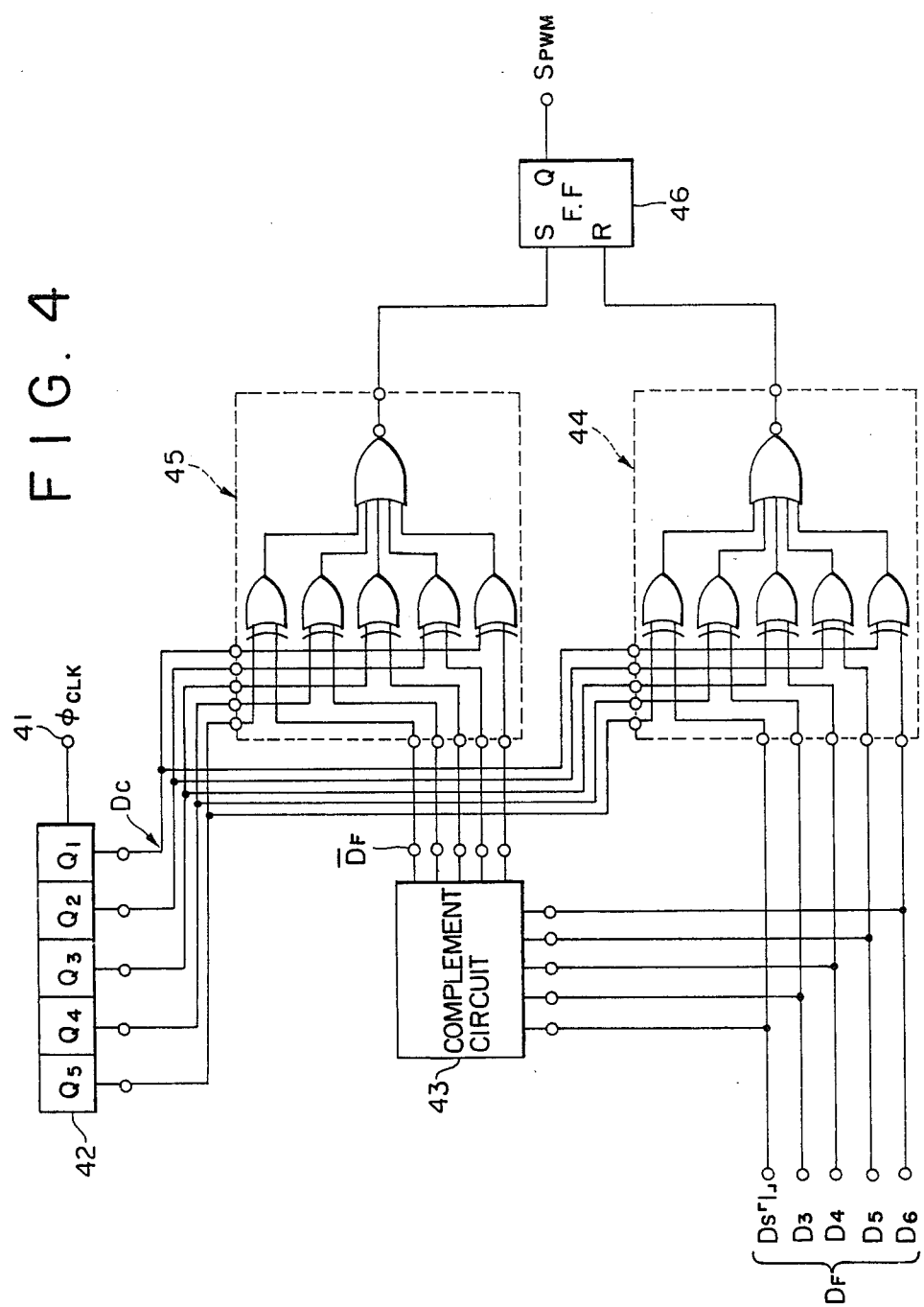
FIG. 4 is a schematic representation of an example of PWM control section employed in the same embodiment.

The PWM control section 4 may have a construction as shown in FIG. 4.

As is shown, the PWM control section 4 includes a $(n_L+1)$-bit, i.e., 5-bit, counter 42, a complement circuit 43, a first coincidence detection circuit 44, a second coincidence detection circuit 45, and a R-S flip-flop 46. The counter 42 counts clock pulses $\phi_{CLK}$ at a clock frequency $f_{CLK}$ supplied to a clock input terminal 41. The complement circuit 43 provides 2's complement data $\overline{D_F}$ to the 5-bit data $D_F$ consisting of bits $D_S$ and $D_3$ to $D_6$ supplied from the secondary data input terminal 5 and S/P converter 2. The first coincidence detection circuit 44 compares the 5-bit data $D_F$ and count output data $D_C$ consisting of bits $Q_5$ to $Q_1$ provided from the counter 42 to effect coincidence detection. The second coincidence detection circuit 45 compares the 2's complement data $\overline{D_F}$ and count output data $D_C$ to effect coincidence detection. The R-S flip-flop 46 is reset by a coincidence detection output of the first coincidence detection circuit 44 and set by a coincidence detection output of the second coincidence detection circuit 45.

The complement circuit 43 provides 2's complement data $D_F$ as shown in Table 1 below to the 5-bit data $D_F$ consisting of the one-bit data $D_S$ and lower order $n_L$-bit data.

TABLE 1

| Operation of complement circuit | | |
|---|---|---|
| Lower order $n_L$-bit data of bits $D_3$ to $D_6$ | 5-bit data $D_F$ | Complement data $\overline{D_F}$ |
| 0001 | 10001 | 01111 |
| 0010 | 10010 | 01110 |
| 0011 | 10011 | 01101 |
| 0100 | 10100 | 01100 |
| 0101 | 10101 | 01011 |
| 0110 | 10110 | 01010 |
| 0111 | 10111 | 01001 |
| 1000 | 11000 | 01000 |
| 1001 | 11001 | 00111 |
| 1010 | 11010 | 00110 |
| 1011 | 11011 | 00101 |
| 1100 | 11100 | 00100 |
| 1101 | 11101 | 00011 |
| 1110 | 11110 | 00010 |
| 1111 | 11111 | 00001 |

Figure 5:
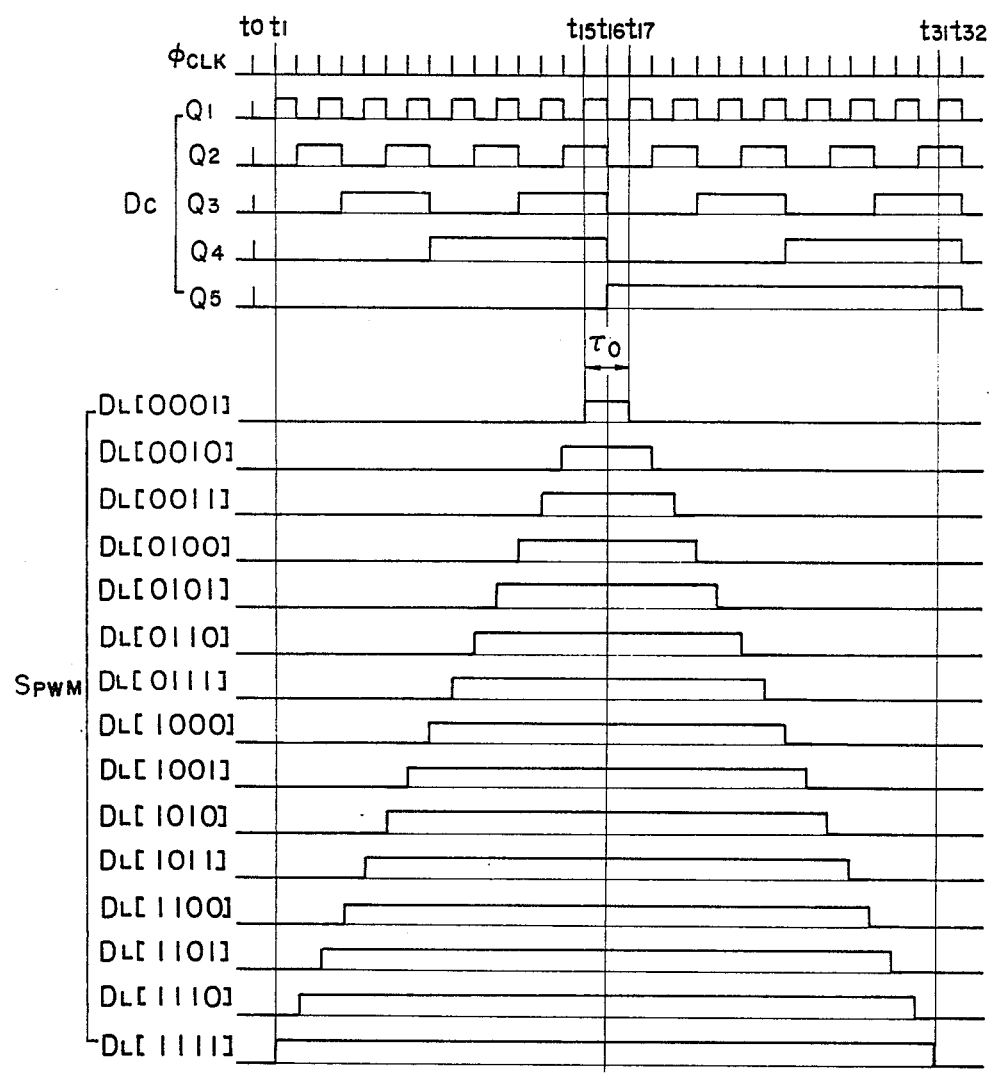
FIG. 5 is a time chart for explaining the operation of the same embodiment.
Figure 6:
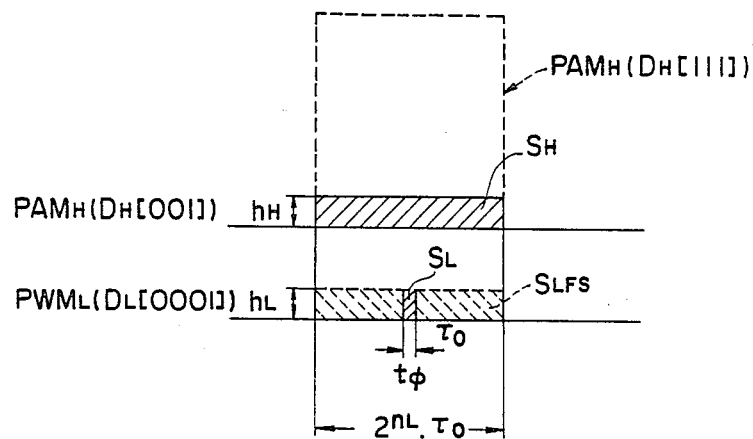
FIG. 6 is a waveform diagram showing an example of pulse widths of PAM wave representing one LSB of higher order $n_H$-bit data and PWM wave representing one LSB of the lower order $n_L$-bit data.

The counter 42 counting clock pulses $\phi_{CLK}$ provides the count output data $D_C$ consisting of bits $Q_5$ to $Q_1$ at timings $t_0$ to $t_{32}$ as shown in FIG. 5.

The first conincidence detection circuit 44 comparing the count output data $D_C$ and 5-bit data $D_F$, resets the R-S flip-flop 46 with its coincidence detection output provided at timings $t_{17}, t_{18}, \ldots, t_{31}$ for each bit of the 5-bit data DF. The second coincidence detection circuit 45 comparing the count output data $D_C$ and complement data $\overline{D_F}$, sets the R-S flip-flop 46 with its coincidence detection output provided at timings $t_{15}, t_{14}, \ldots, t_1$ for each of the complement data $\overline{D_F}$.

The R-S flip-flop 46 operated by the outputs of the coincidence detection circuits 44 and 45, provides a PWM control signal SPWM as shown in FIG. 5, with the pulse width varying symmetrically with respect to the timing $t_{16}$ according to the lower order $n_L$-bit data $D_L$.

The PAM control section 3 produces a PAM control signal $S_{PAM}$ which is timed to the PWM control signal $S_{PWM}$ provided from the PWM control section 4 according to the higher order $n_H$-bit data $D_H$ consisting of bits $D_0$ to $D_2$, the PAM control signal $S_{PAM}$ being supplied to a modulating section 10.

The modulating section 10 includes constant current sources 14 to 16 and 18, an operational amplifier 20 and feedback resistor 22. The constant current sources 14 to 16 are respectively connected to $n_H$ switches 11 to 13 which are controlled for switching by the PAM control signal SPAM provided from the PAM control section 3. The constant current source 18 is connected to a switch 17 which is controlled for switching by the PWM control signal $S_{PWM}$ provided from the PWM control section 4. The operational amplifier 20 has an inversion input terminal 19 which can be connected to the constant current sources 14 to 16 and 18 through the switches 11 to 13 and 18. The feedback resistor 22 is connected between an output terminal 21 and inversion input terminal of the operational amplifier 20. The non-inversion input terminal of the operational amplifier 20 is grounded.

The switches 11 to 13 controlled for switching by the PAM control signal $S_{PAM}$, i.e., the higher order $n_H$-bit data $D_H$, produce a PAM wave $PAM_H$ having a peak level $h_H$ which is determined by current levels $I_1$ to $I_3$ ($I_1 = 4I_0$, $I_2 = 2I_0$, $I_3 = I_0$) of the respective constant current sources 14 to 16 provided with weights selected by the switching operation. The PAM wave $PAM_H$ is supplied to the operational amplifier 20. The switch 17 for switching according to the PWM control signal $S_{PWM}$, the pulse width of which is varied according to the lower order $n_L$-bit data $D_L$, produces a PWM wave $PWM_L$ having a peak level $h_L$ which is determined by the current level $I_4$ of the constant current source. 18. The PWM wave $P_{WML}$ is supplied to the operational amplifier 20.

The current level $I_4$ of the constant current source 18 for forming the PWM wave $PWM_L$, is set equal to the current level $I_0$ of the constant current source 16 for the PAM. In this embodiment, the continuity between the PAM and PWM waves $PAM_H$ and $PWM_L$ is ensured with the pulse width of the PAM wave $PAM_H$ set such that the area $S_H$ of the PAM wave $PAM_H$ representing one LSB of the $n_H$ higher order bits is equal to an area $SS_{LF}$ which is $2^{n_L}$ times the area $S_L$ of the PWM wave $PWM_L$ representing one LSB of the $n_L$ lower order bits.

To meet the condition $SH = S_{LFS}$, the current level $I_4$ of the constant current source 18 for the PWM and the pulse width $\tau_H$ of the PAM wave $PAM_H$ may be set as $$\frac{I_0}{I_4} = 2^{nL} \cdot \frac{\tau_0}{\tau_H}$$

where $\tau_0$ is the pulse width of one LSB of the PWM wave $PWM_L$.

Figure 7:
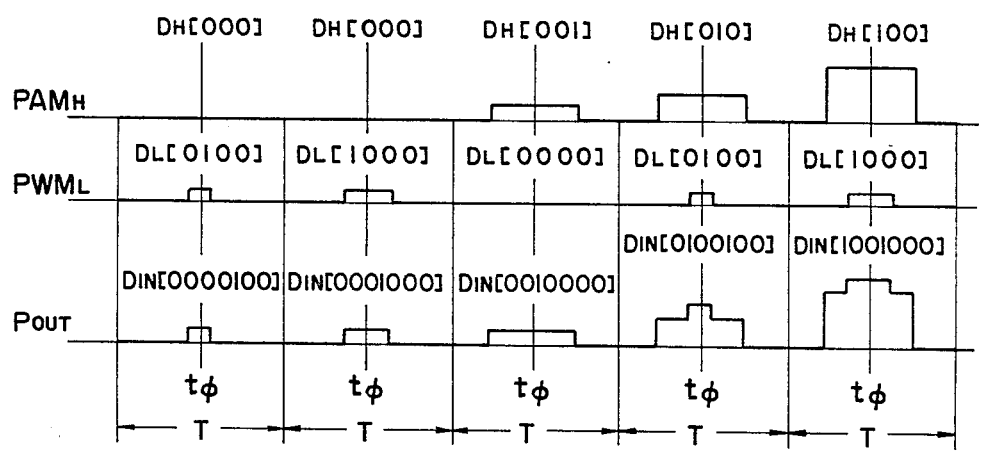
FIG. 7 is a waveform diagram showing an example of PWM wave output obtained through additive combination of individual PWM waves in the same embodiment.

The operational amplifier 20 additively combines the PAM and PWM waves $PAM_H$ and $PWM_L$ formed by the switching operation of the switches 11 to 13 and 17 to produce resultant pulses $P_{OUT}$ as shown in FIG. 7.

Figure 8:
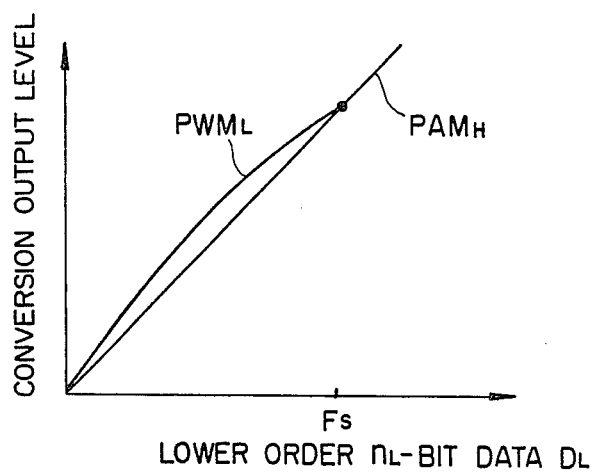
FIG. 8 is a characteristic graph showing the linearity of PWM wave in the same embodiment.
Figure 9:
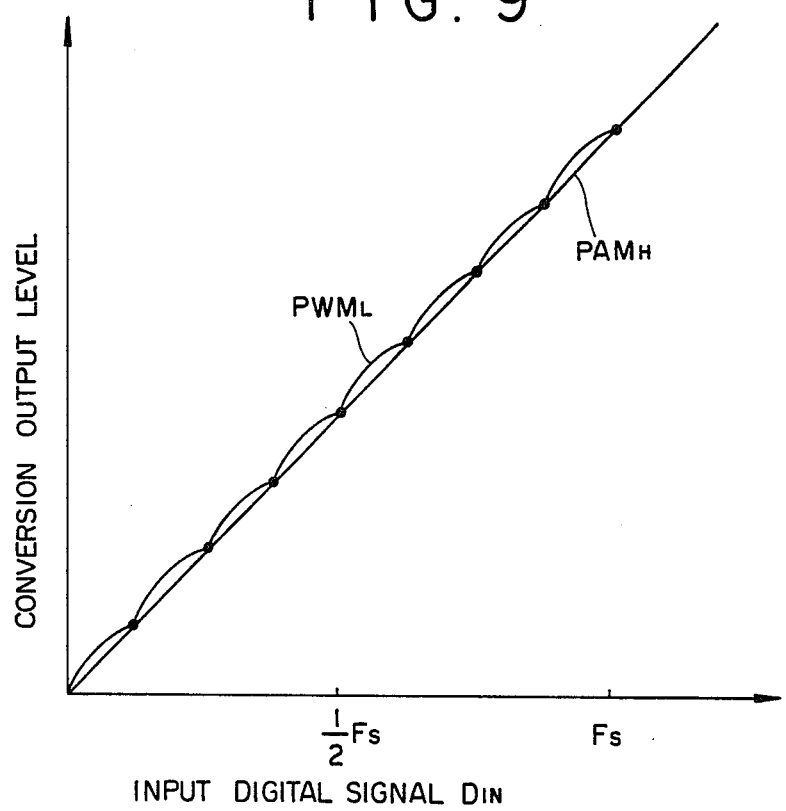
FIG. 9 is a graph showing an D/A conversion characteristic obtained with the same embodiment.

The PWM wave $PWM_L$ supplied to the operational amplifier 20 is symmetrical with respect to the center $t_\phi$ of one conversion period T, so that it coincides with the PAM wave in full scale (FS) without including any error due to FM compohents. In addition, the energy is concentrated in the center $t_\phi$. Thus, the error due to the non-linearity of conversion characteristic of conversion through interpolation by the low-pass filter to the analog signal is small as shown in FIG. 8. Thus, the resultant pulses $P_{OUT}$ obtained by addition of the PWM and PAM waves $PWM_L$ and $PAM_H$ in timed relation to each other, provide, when converted through interpolation by the low-pass filter to the analog signal, a D/A conversion characteristic having excellent linearity shown in FIG. 9.

Further, in this embodiment the N-bit digital data is divided into higher order $n_H$ bits and lower order $n_L$ bits, and the lower order $n_L$-bit data is converted to the PWM wave. Thus, it is possible to reduce the operation frequency of the pulse width control counter used for the formation of the PWM wave.

While in the above embodiment the N-bit input digital data is divided into the higher order $n_H$ bits and lower order $n_L$ bits, in case where the input digital data to be D/A converted has a large number N of bits, it is possible to divide the input digital data to three or more divisions.

Figure 10:
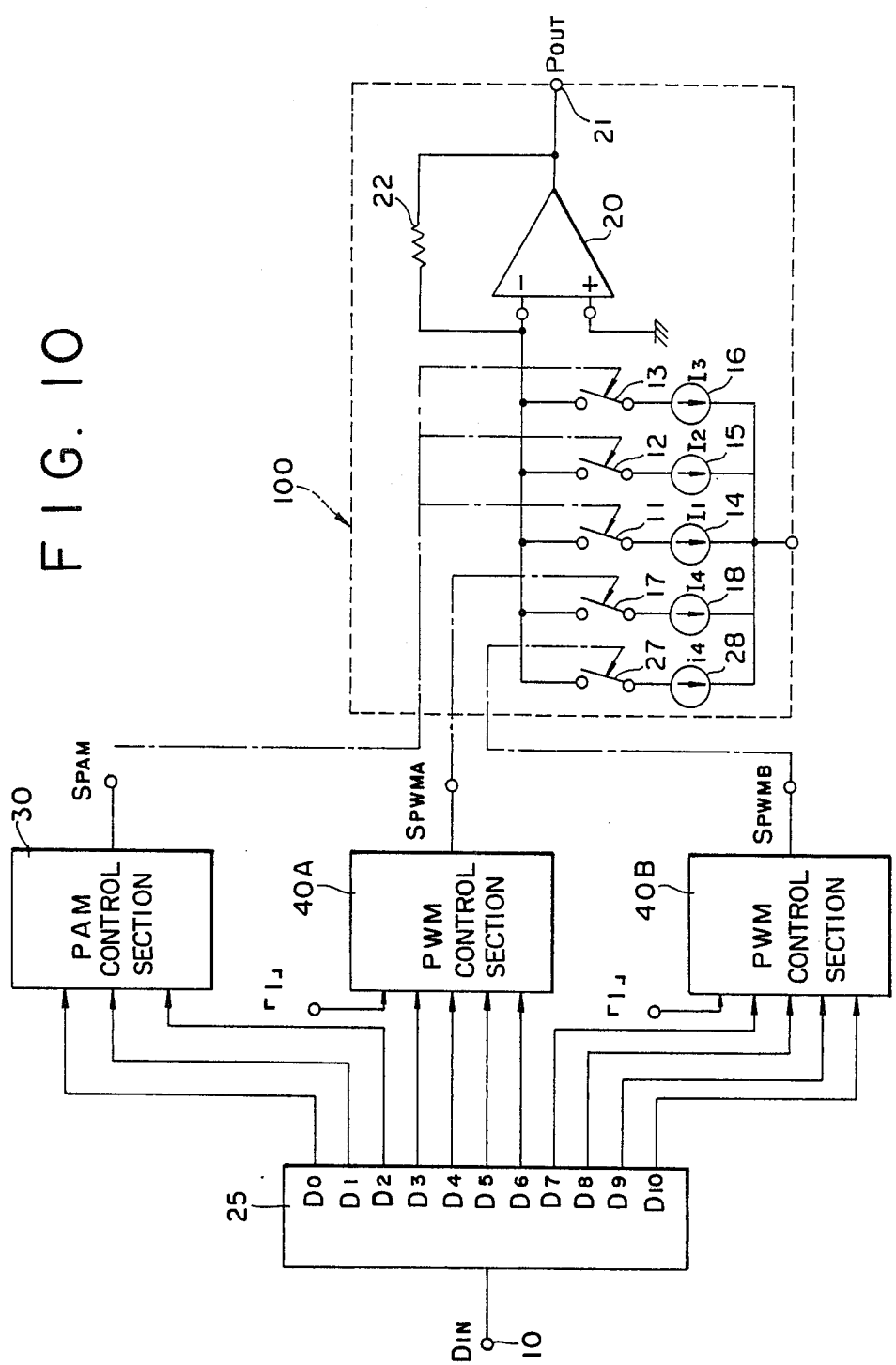
FIG. 10 is a schematic representation of a second embodiment of the digital-to-analog converting system according to the present invention.

FIG. 10 shows a different embodiment, in which the lower order $n_L$-bit data is further divided into $n_{l1}$-bit data and $n_{l2}$-bit data to be converted to respective PWA waves $PWM_{l1}$ and $PWM_{l2}$.

In this second embodiment, a S/P converter 25 converts N-bit (i.e., 11-bit) serial data $D_{IN}$ consisting of bits $D_0$ to $D_{10}$ supplied from the data input terminal 10 to parallel data $D_P$ consisting of bits $D_0$ to $D_{10}$. Of this data, the higher order $n_H$-bit (i.e., 3-bit) data $D_H$ consisting of bits $D_0$ to $D_2$ is supplied to a PAM control section 30. The lower order $n_L$-bit (i.e., 8-bit) data $D_L$ consisting of $D_3$ to $D_{10}$ is divided into $n_{l2}$-bit (i.e., 4-bit) data and $n_{l2}$-bit (i.e., 4-bit) data. The $n_{l1}$-bit data $D_{l1}$ consisting of bits $D_3$ to $D_6$ is supplied to a first PWM control section 40A, and the $n_{l2}$-bit data $D_{l2}$ consisting of bits $D_7$ to $D_{10}$ is supplied to a second PWM control section 40B.

The first and second PWM control sections 40A and 40B may have the same construction as that described before in connection with FIG. 4. The PAM control section 30 is also the same as in the preceding embodiment.

A modulating section 100 includes, in addition to the components described before in connection with the preceding embodiment, a PWM switch 27 controlled for switching by a PWM control signal $S_{PWMB}$ supplied from the second PWM control section 40B and a constant current source 28 connected to the switch 27.

The current level $I_4$ of the constant current source 18 connected to the switch 17 controlled for switching by the PWM control signal $S_{PWMA}$ from the first PWM control section 40A and the current level $i_4$ of the constant current terminal 28 connected to the switch 27 controlled for switching by the PWM control signal $S_{PWMB}$ from the second PWM control section 40B, are set according to the ratio $\tau_{l1}\tau_{l2}$ of the pulse width $\tau_{l1}$ representing one LSB of the $n_{l1}$-bit data $D_{l1}$ and the pulse width $\tau_{l2}$ of one LSB of the $n_{l2}$-bit data $D_{l2}$ such that the peak values $h_{l1}$ and $h_{l2}$ of the PWM waves $PWM_{l1}$ and $PWM_{l2}$ are related as $$\frac{h_{l1}}{h_{l2}} = 2^{n_{l2}} \cdot \frac{\tau_{l2}}{\tau_{l1}}$$

Figure 11:
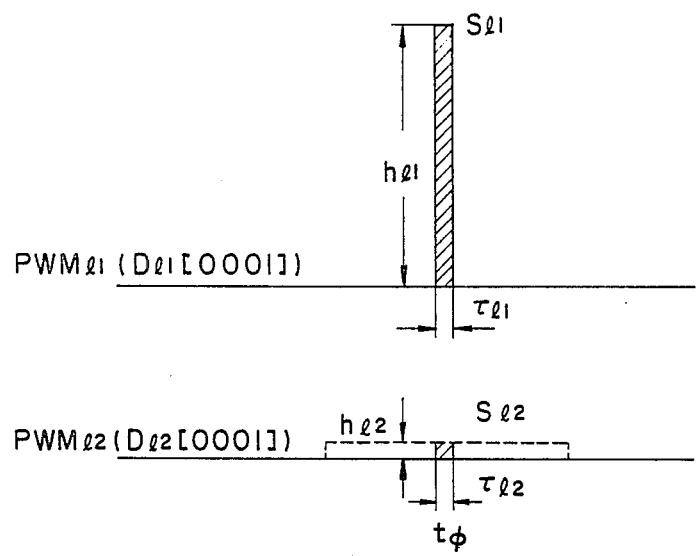
FIG. 11 is a waveform diagram showing an example of pulse widths of PWM wave representing one LSB of higher order $n_{f1}$-bit data and PWM wave representing one LSB of lower order $n_{f2}$-bit data in the same embodiment.

As shown in FIG. 11, the time integral value $S_{l1}$ of the higher order one LSB is $$S_{l1} = h_{l1} \times \tau_{l1}$$

while the time integral value $S_{l2}$ of the lower order one LSB is $$S_{l2} = h_{l2} \times \tau_{l2}$$

Thus, $S_{l1}$ is set to $S_{l1} = 2^{n_{l2}} \cdot S_{l2}$ to accurately represent the lower order $n_L$-bit digital data $D_L$ by the PWM wave.

Figure 12:
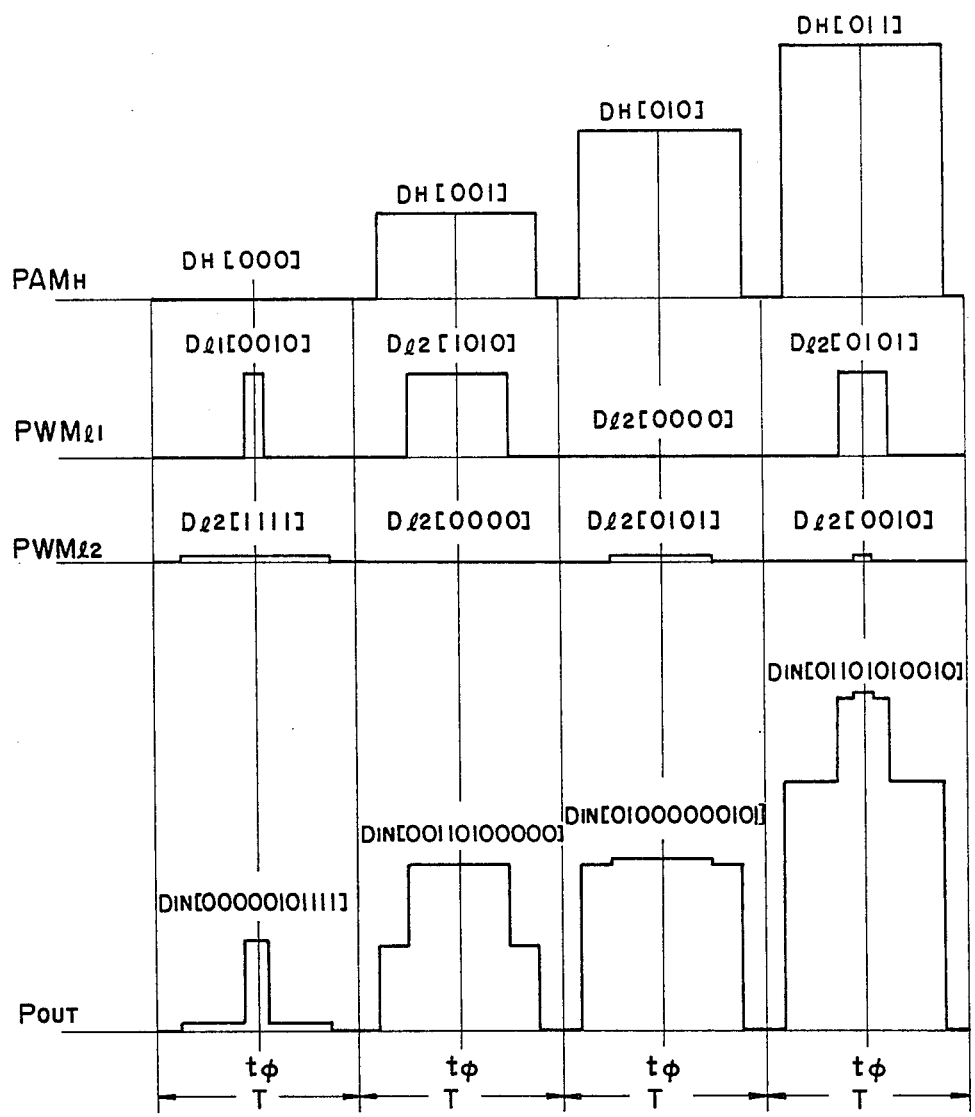
FIG. 12 is a waveform diagram showing an example of PWM wave output obtained through additive combination of individual PWM waves in the same embodiment.

The operational amplifier 20 additively combines the PAM and PWM waves $PAM_H$, $PWM_{l1}$ and $PWM_{l2}$ that are formed by the switching operation of the switches 11 to 13, 17 and 27 to produce resultant pulses $P_{OUT}$ as shown in FIG. 12.

With the arrangement of this embodiment, in which the lower order $n_L$-bit data in the N-bit input digital data is divided into $n_{l1}$-bit data and $n_{l2}$-bit data for conversion to respective PWM waves $PWM_{l1}$ and $PWM_{l2}$, it is possible to further reduce the operation frequency of the counter necessary for forming the PWM wave compared to that in the previous first embodiment.

For example, when the lower order $n_L$-bit data converted to the PWM waves $PWM_{l1}$ and $PWM_{l2}$ consists of 16 bits (with $n_{l1} = n_{l2} = 8$-bit), if the maximum pulse width in one conversion period T is $\tau_{max/l1} = \tau_{max/l2} = 10$ μsec., the pulse widths $\tau_{l1}$ and $\tau_{l2}$ necessary for one LSB are $$\tau_{l1} = \frac{\tau_{max/l1}}{2 \cdot (2^{8-1})}$$

$$\tau_{l2} = \frac{\tau_{max/l2}}{2 \cdot (2^{8-1})}$$

The clock frequencies $f_{CLK/l1}$ and $f_{CLK/l2}$ used for the PWM control sections 40A and 40B are thus $$f_{CLK/l1} = f_{CLK/l2} = \frac{2 \cdot (2^{8-1})}{10 \text{ μsec.}}$$

$$\approx 51.2 \text{ MHz}$$

There is no need of setting the pulse width $\tau_{l1}$ representing one LSB of the $n_{l1}$-bit data $D_{l1}$ and pulse width $\tau_{l2}$ representing one LSB of the $n_{l2}$-bit data $D_{l2}$. For example, the counters may be operated by setting $f_{CLKZ/l1} = 2f_{CLK/l2}$ and the pulse widths $\tau_{l1}$ and $\tau_{l2}$ are set such that $\tau_{l1} : \tau_{l2} = 1:2$ for additively combining the PWM waves $PWM_{l1}$ and $PWM_{l2}$ with the PAM wave $PAM_H$.

Figure 13:
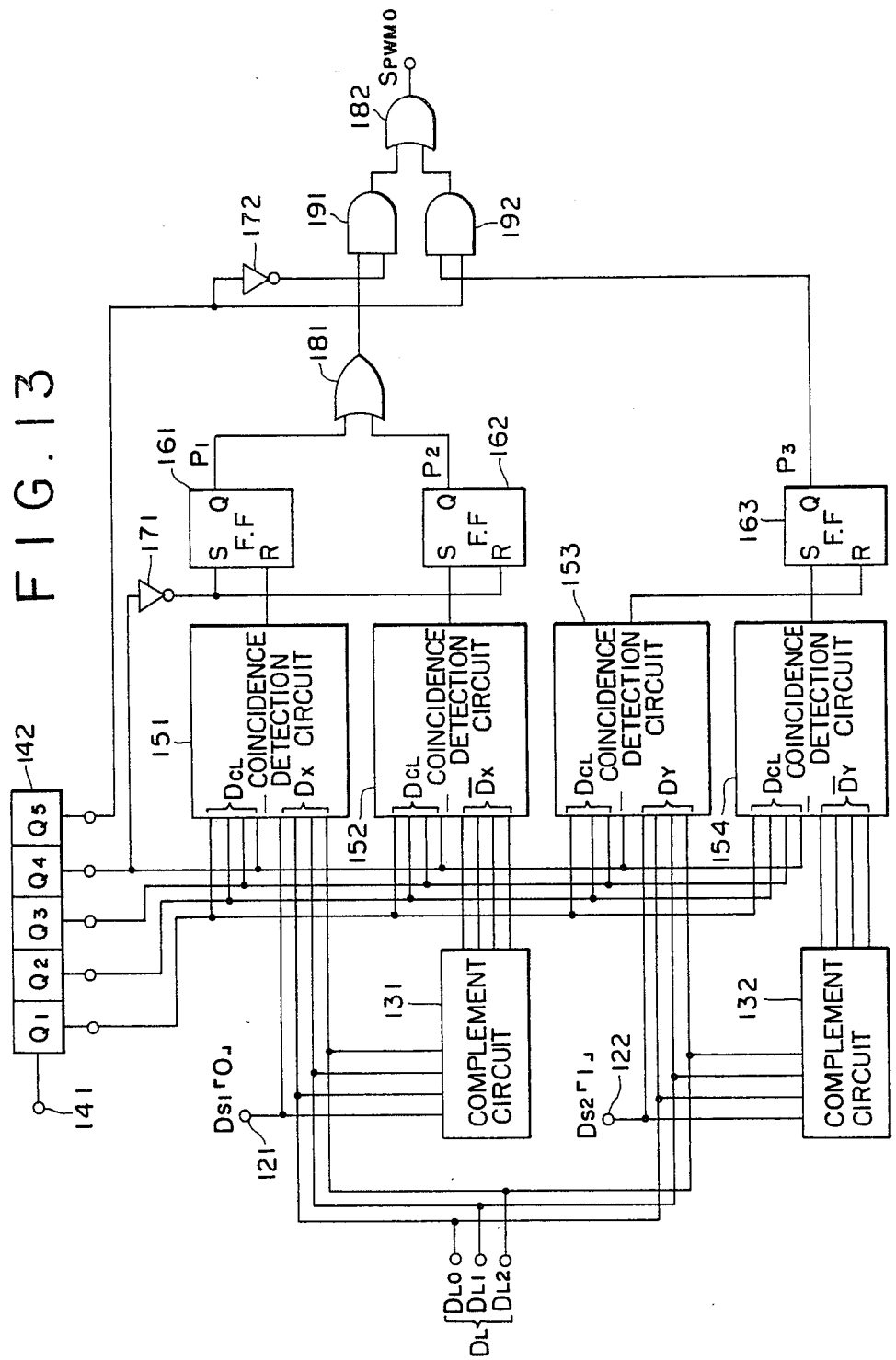
FIG. 13 is a schematic representation of a different example of PWM control section employed in the first embodiment.

FIG. 13 shows a block diagram showing a different example of the PWM control section 4 in the first embodiment shown in FIG. 3.

In an example shown in FIG. 13, of the input digital data DIN the lower order $n_L$-bit (i.e., 3-bit) data $D_L$ consisting of bits $D_{L0}$ to $D_{L2}$ are converted to PWM wave $PWM_{OUT}$.

Figure 14:
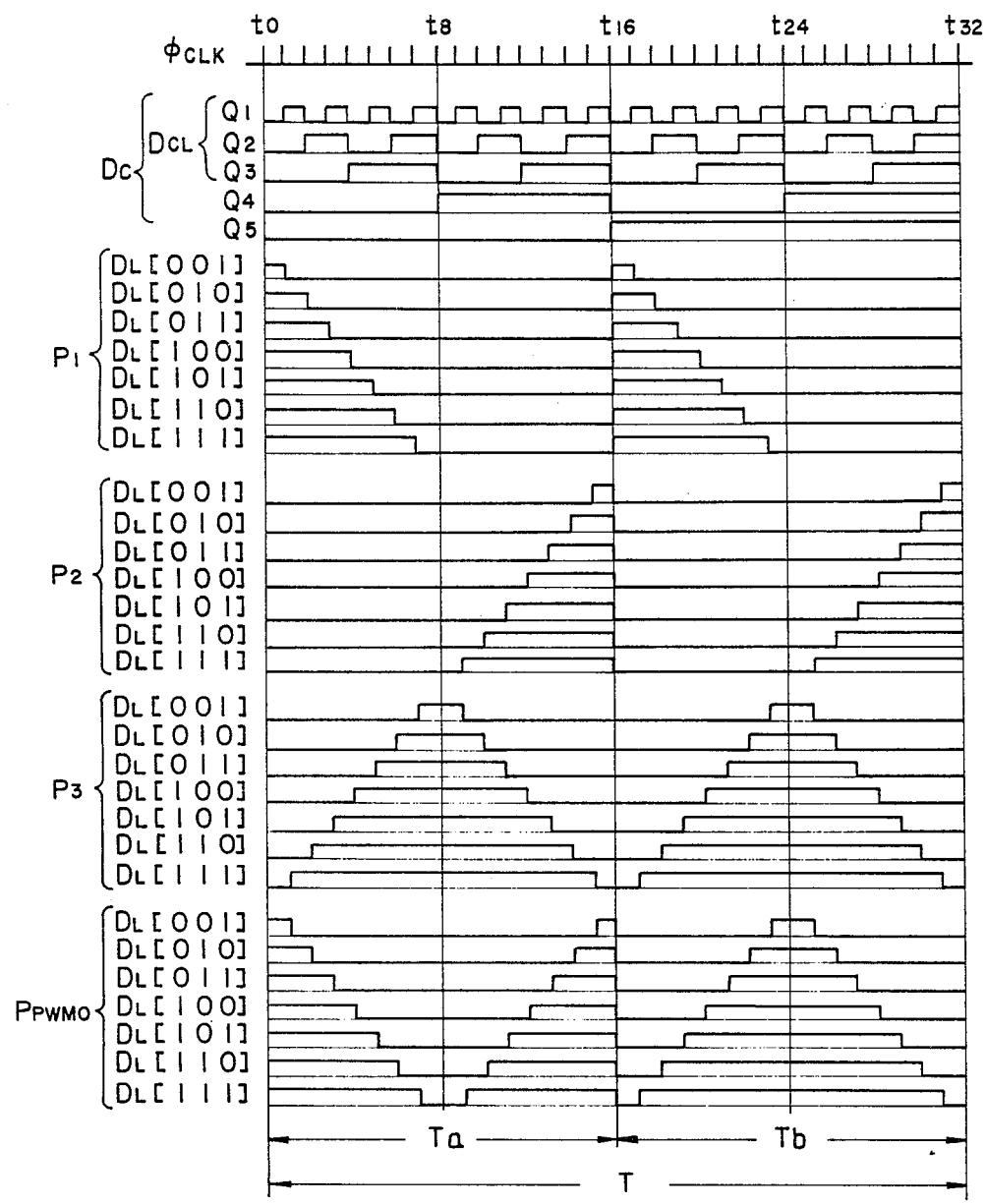
FIG. 14 is a time chart illustrating the operation of the same example.

The PWM control section in this embodiment includes a 5-bit counter 142 for counting clock pulses $\phi_{CLK}$ supplied at frequency $f_{CLK}$ to a clock input terminal 141 and first to fourth coincidence detection circuits 151 to 154 for effecting coincidence detection with respect to the lower order 4-bit data $D_{CL}$ consisting of bits $Q_4$ to $Q_1$ of the 5-bit count output data $D_C$ consisting of bits $Q_5$ to $Q_1$ provided for timings $t_0, t_1, t_2, \ldots$ shown in FIG. 14 through the counting of clock pulses $\phi_{CLK}$ by the counter 142.

The first coincidence detection circuit 151 receives the lower order $n_L$-bit data $D_L$ consisting of bits $D_{L0}$ to $D_{L2}$ and also a one-bit data $D_{S1}$ of logic level "0" supplied from a first secondary data input terminal 121. It compares for coincidence detection 4-bit data $D_X$ consisting of bits $D_{S1}$ and $D_{L0}$ to $D_{L2}$, which is obtained by adding the one-bit data $D_{S1}$ to the MSB side of the lower order $n_L$-bit data $D_L$, and the count output data $D_{CL}$ consisting of bits $Q_4$ to $Q_1$ from the counter 142. The coincidence detection output obtained from the first coincidence detection circuit 151 is supplied as reset pulse to a first flip-flop 161.

The second coincidence detection circuit 152 receives 2's complement data the 4-bit data $\overline{D_x}$ consisting of the one-bit data $D_{S1}$ and lower order $n_L$-bit data $D_L$ supplied from a first complement circuit 131. It compares for coincidence detection the complement data $\overline{D_x}$ and count output data $D_{CL}$. The coincidence detection output obtained from the second coincidence detection circuit 152 is supplied as set pulse to a second flip-flop 162.

The third coincidence detection circuit 153 receives the lower order $n_L$-bit data $D_L$ and one-bit data $D_{S2}$ of logic level "1" supplied from the second secondary data input terminal 122. It compares for coincidence detection 4-bit data $D_Y$ consisting of bits $D_{S2}$ and $D_{L0}$ to $D_{L2}$ obtained by addition of the one-bit data $D_{S2}$ to the MSB side of the lower order $n_L$-bit data $D_L$ and count output data $D_{CL}$ consisting of bits $Q_4$ to $Q_1$ from the counter 142. The coincidence detection output obtained from the third coincidence detection circuit 153 is supplied as reset pulse to a third flip-flop 163.

The fourth coincidence detection circuit 154 receives 2's complement data $\overline{D_y}$ to 4-bit data $D_Y$ obtained by addition of the one-bit data $D_{S2}$ of logic level "1" to the lower order $n_L$-bit data $D_L$ supplied from a second complement circuit 132. It compares for coincidence detection the complement data $\overline{D_y}$ and count output data $D_{CL}$. The coincidence detection output obtained from the fourth coincidence detection circuit 154 is supplied as set pulse to the third flip-flop 163.

The first flip-flop 161 receives the fourth bit data $Q_4$ from the counter 142 supplied as set pulse through an inverter 171, and it is set by the set pulse at timing $t_0$ (t16) shown in FIG. 14. When the first flip-flop 161 is reset by the coincidence detection output obtained from the first coincidence detection circuit 151, it produces a first control pulse $P_1$ that falls at each of timings $t_1$ ($t_{17}$), $t_2$ ($t_{18}$), ... $t_7$ ($t_{23}$) according to the lower order $n_L$-bit data $D_L$ consisting of bits $D_{L1}$ to $D_{L3}$.

The second flip-flop 162 receives a reset pulse from the inverter 171. It is set by the coincidence detection output obtained from the second coincidence detection circuit 152 at each of timings $t_{15}$ ($t_{31}$), $t_{14}$ ($t_{30}$), ..., $t_9$ ($t_{25}$) according to the lower order $n_L$-bit data $D_L$, and is reset at timing $t_{16}$ ($t_{32}$) by the reset pulse, whereby it provides a second control pulse $P_2$ as shown in FIG. 14.

The control pulses $P_1$ and $P_2$ obtained from the first and second flip-flops 161 and 162 are supplied to a first AND gate 191 through a first OR gate 181.

The third flip-flop 163 is set by the coincidence detection output obtained from the fourth coincidence detection circuit 154 at each of timings ($t_7$) $t_{23}$, ($t_6$) $t_{22}$, ..., ($t_1$) $t_{17}$ according to the lower order $n_L$-bit data $D_L$, and is reset by the coincidence detection output obtained from the third coincidence detection circuit 153 at each of timings ($t_9$) $t_{25}$, ($t_{10}$) $t_{26}$, ..., ($t_{15}$) $t_{31}$ according to the lower order $n_L$-bit data $D_L$, whereby it provides a third control pulse $P_3$ as shown in FIG. 14. The third control pulse $P_3$ is supplied to a second AND gate 192.

The MSB data $Q_5$ from the counter 142 is supplied as gate control pulse through the inverter 172 to the first AND gate 191. Thus, the AND gate 191 is held enabled for a period Ta from the instant $t_0$ to the instant $t_{16}$ to permit the first and second control pulses $P_1$ and $P_2$ to be supplied to the second OR gate 182. The MSB data $Q_5$ from the counter 142 is also supplied as gate control pulse to the second AND gate 192. The second AND gate 192 is thus held enabled for a period Tb from the instant $t_{16}$ to the instant $t_{32}$ to permit the third control pulse $P_3$ to be supplied to the second OR gate 182.

The OR gate 182 permits during a first period Ta first and second control pulses $P_1$ and $P_2$ with the pulse width thereof varying symmetrically with respect to a timing $t_8$ according to the lower order $n_L$-bit data $D_L$ and also permits during a second period Tb third control pulse $P_3$ with the pulse width thereof varying symmetrically with respect to a timing $t_{24}$, as shown in FIG. 14. A PWM control signal $S_{PWM0}$ which is the resultant of the first to third control pulses $P_1$ to $P_3$ is supplied to the modulating section 10 in the previous first embodiment.

In the modulating section 10 the fourth switch 18 is controlled for switching by the PWM control signal $S_{PWM0}$, whereby two different PWM waves $PWM_1$ and $PWM_2$ of different pulse width variations and with the pulse width thereof varying symmetrically with respect to the timings $t_8$ and $t_{24}$ according to the lower order $n_L$-bit data $D_L$ are provided each once in one conversion period T, the former wave during the first period Ta and the latter wave during the second period Tb.

Figure 15:
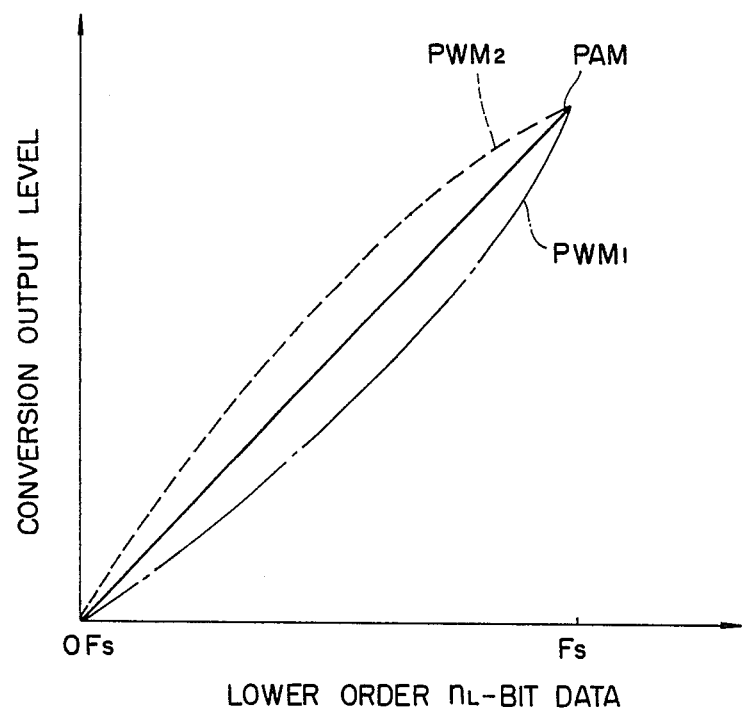
FIG. 15 is a characteristic graph showing the linearity of PWM wave obtained in the same example.

The PWM wave $PWM_1$ provided from the modulating section 10 during the first period Ta, is formed from the first and second control pulses $P_1$ and $P_2$ with the pulse widths thereof varying symmetrically with respect to the timing $t_8$. Since the energy of this wave is dispersed symmetrically with respect to the timing $t_8$, the conversion thereof through interpolation by the low-pass filter into the analog signal is obtained with a conversion characteristic as shown by a phantom plot in FIG. 15, with the instantaneous conversion output level being lower than the instantaneous output level of the PAM wave between OFS and FS (full scale) and coinciding with the PAM wave instantaneous output level in the OFS and FS. The energy of the PWM wave $PWM_2$ provided during the second period Tb, is symmetrical with respect to and concentrated on the timing $t_{24}$, so that a conversion characteristic as shown by a dashed plot in FIG. 15 can be obtained.

With the two different PWM waves $PWM_1$ and $PWM_2$ of different pulse width variations provided during the respective first and second periods Ta and Tb in one conversion period T as in the above example, the conversion errors due to the PWM waves $PWM_1$ and $PWM_2$ can be cancelled to obtain excellent linearity of the D/A conversion.

Although in the above example the two different PWM waves are provided each once during one conversion period T, it is possible to provide the individual PWM waves alternately repeatedly a plurality of times in one conversion period T.

Figure 16:
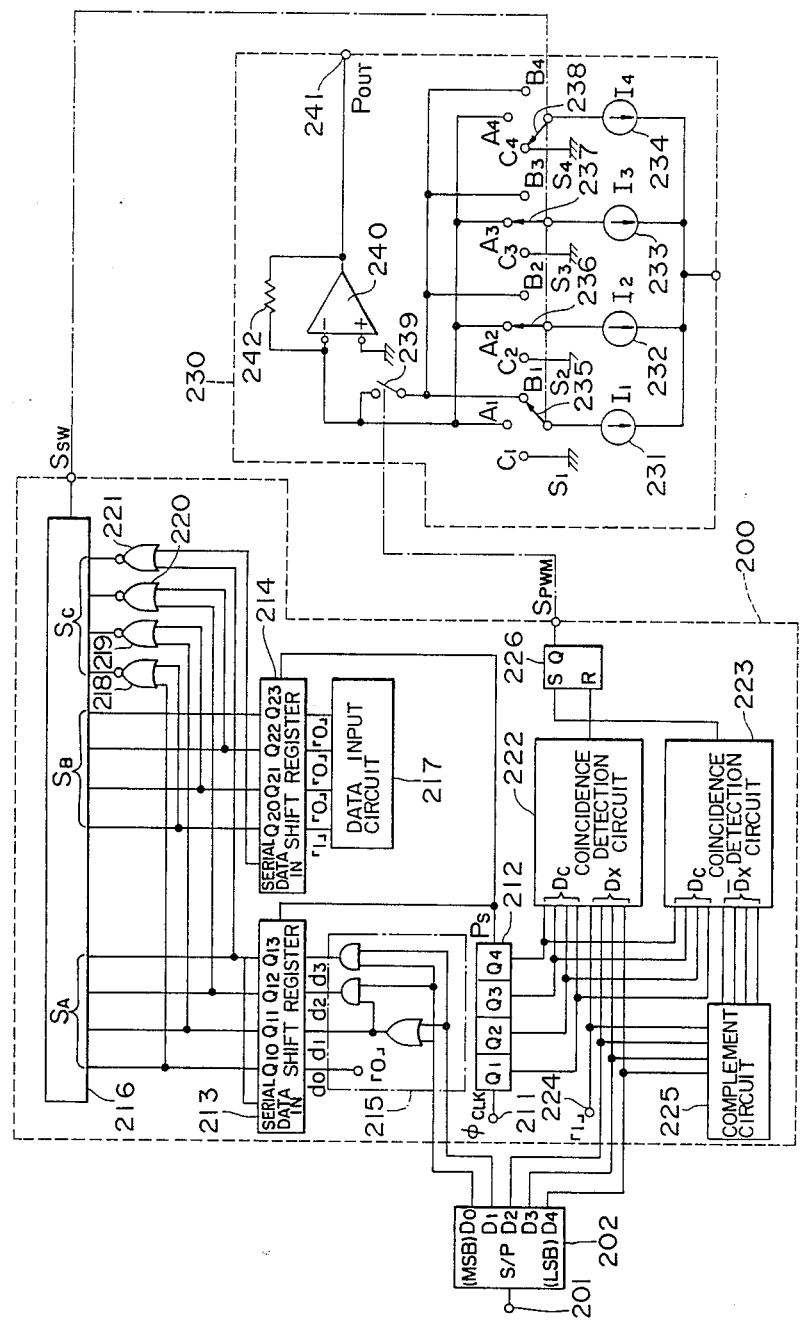
FIG. 16 is a schematic representation of a third embodiment of the digital-to-analog converting system according to the present invention.

FIG. 16 is a block diagram showing a third embodiment of the present invention. N-bit serial data which is obtained through quantization of the analog signal for every sampling period $T_S$, is supplied to a data input terminal 201. In this embodiment, 5-bit serial data $D_S$ consisting of bits $D_0$ to $D_4$ is supplied to the data input terminal 201.

The serial data $D_S$ is supplied from the data input terminal 201 to a serial-to-parallel (S/P) converter 202 for conversion to parallel data $D_P$ consisting of bits $D_0$ to $D_4$.

The parallel data $D_P$ obtained from the S/P converter 202, is supplied to a modulation control section 200.

The modulation control section 200 includes a 4-bit counter 212, which counts clock pulses $\phi$CLK at frequency $f_{CLK}$ supplied from a clock input terminal 211, and first and second 4-bit shift registers 213 and 214, which operate with $\frac{1}{4}$ frequency division output pulses $P_S$ from the counter 212 as clock.

The MSB outputs $Q_{13}$ and $Q_{23}$ of the shift registers 213 and 214 are supplied back to the respective serial data input terminals, and these shift registers shift 4-bit data cyclically with the frequency division output pulse $P_S$ from the counter 212 as clock.

Of the N-bit parallel data DP consisting of bits $D_0$ to $D_4$ obtained from the S/P converter 202, the MSB side higher order $n_H$-bit (i.e., 2-bit) data $D_H$ consisting of bits $D_0$ and $D_1$ of great weights is converted through a PAM decoder 215 to 4-bit data $D_{PAM}$ consisting of bits $d_0$ to $d_3$, which is supplied to the first shift register 213.

The PAM decoder 215 converts the higher order $n_H$-bit data $D_H$ consisting of bits $D_0$ and $D_1$ such that $$d_0 = 0$$

$$d_1 = D_0 + D_1$$

$$d_2 = (D_0 + D_1) \cdot D_1$$

and $$d_3 = D_0 \cdot D_1$$

Figure 17:
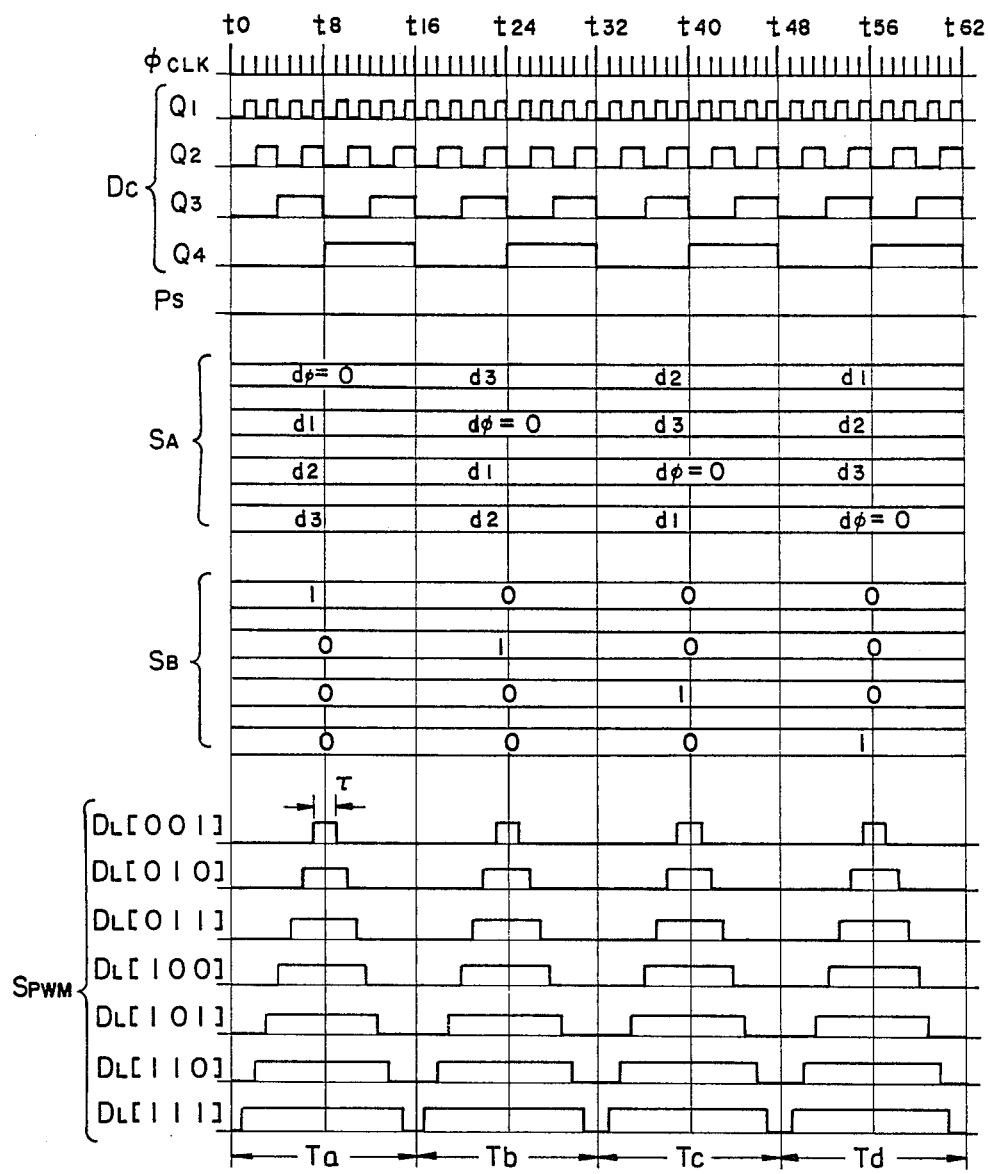
FIG. 17 is a time chart for explaining the operation of the same embodiment.

It may consist of OR and AND gates. The 4-bit data $D_{PAM}$ consisting of bits $d_0$ to $d_3$ obtained from the PAM decoder 215 is loaded as parallel data in the first shift register 213 for every one sampling period $T_S$, and is cyclically shifted therethrough for each timing of appearance of the frequency division output pulse $P_S$ as shown in FIG. 17.

The first shift register 213 supplies a first control data $S_A$ consisting of 4 bits cyclically shifting the 4-bit data DPAM consisting of bits $d_0$ to $d_3$ to a switching control circuit 216.

The 4-bit data consisting of bits "1, 0, 0, 0" from a data input circuit 217 is loaded as parallel data in the second shift register 214 for every one sampling period $T_S$. The second shift register 214 cyclically shifts the 4-bit data at every timing of the frequency division output pulse $P_S$ as shown in FIG. 17 to provide second control data $S_B$ of 4 bits, whereby the control data is supplied to the switching control circuit 216.

The 4-bit control data $S_A$ and $S_B$ provided from the shift registers 213 and 214 are supplied through NOR gates 218 to 221 to produce third control data $S_C$ which is supplied to the switching control circuit 216.

The modulation control section 200 also includes first and second coincidence detection circuits 222 and 223 which executes coincidence detection with respect to the 4-bit count output data $D_C$ consisting of bits $Q_4$ to $Q_1$ provided at every timings $t_0$, $t_1$, $T_2$, ... as shown in FIG. 17 through the counting of clock pulses $\phi_{CLK}$ by the counter 212.

The first coincidence detection circuit 222 receives the LSB side lower order $n_L$-bit (i.e., 3-bit) data $D_L$ consisting of bits $D_2$ to $D_4$ of small weights in the N-bit parallel data $D_P$ obtained from the S/P converter 202 and also receives one-bit data $D_S$ of logic level "1" supplied from a secondary data input terminal 224. It compares for coincidence detection 4-bit data $D_X$ consisting of bits $D_S$ and $D_2$ to $D_4$ obtained through addition of the one-bit data $D_S$ to the MSB side of the lower order $n_L$-bit data $D_L$ consisting of bits $D_2$ to $D_4$ and count output data $D_C$ consisting of bits $Q_4$ to $Q_1$ from the counter 212. The coincidence detection output obtained from the first coincidence detection circuit 222 is supplied as reset pulse to a flip-flop 226.

The second coincidence detection circuit 223 receives the complement data $\overline{D_X}$ of the 4-bit data $D_X$ as the result of addition of the one-bit data $D_S$ to the lower order $n_L$-bit data $D_L$ consisting of bits $D_2$ to $D_4$ supplied from a complement circuit 225, and it compares for coincidence detection the complement data $\overline{D_X}$ and count output data $D_C$. The coincidence detection output of the second coincidence detection circuit 223 is supplied as set pulse to the flip-flop 226.

The coincidence detection circuits 222 and 223 may each consist of four EX.OR gates and one NOR gate.

The flip-flop 226, which is triggered by the coincidence detection outputs of the first and second coincidence detection circuits 222 and 223, provides the PWM control signal $S_{PWM}$, the pulse width $\tau$ of which varies with respect to timings $t_8$, $t_{24}$, $t_{40}$ and $t_{56}$ as shown in FIG. 17 according to the lower order $n_L$-bit data $D_L$ consisting of bits $D_2$ to $D_4$. The timings $t_8$, $t_{24}$, $t_{40}$ and $t_{56}$ are found at the center of respective periods Ta, Tb, Tc and Td which are uniform divisions of one conversion period T.

In this embodiment, a modulating section 230 which is controlled by the modulation control section 200 of the above construction, includes $2^{nH}$, i.e., 4, constant current sources 231 to 234.

The constant current sources 231 to 234 are respectively connected to movable contacts $S_1$ to $S_4$ of four three-contact selection switches 235 to 238. The selection switches 235 to 238 have their first fixed contacts $A_1$ to $A_4$ connected to a inversion input terminal of an operational amplifier 240, while their second fixed contacts $B_1$ to $B_4$ connected to the inversion input terminal noted above through a PWM switch 239 and their third fixed contacts $C_1$ to $C_4$ to ground.

The operational amplifier 240 has its noninversion input terminal connected to ground and its output terminal 241 is connected to its inversion input terminal through a feedback resistor 242.

The PWM switch 239 is controlled for switching by the PWM control signal $S_{PWM}$ provided from the flip-flop 226 of the modulation control section 200.

The four selection switches 235 to 238 are controlled for switching by the switching control signal $S_{SW}$ provided from the switching control circuit 216 of the modulation control section 200.

More specifically, the first selection switch 235 is controlled by the switching control signal $S_{SW}$ such that its movable contact $S_1$ is connected to the first fixed contact $A_1$ when the MSB output $Q_{13}$ of the first shift register 213 of the modulation control section 200 is at logic level "1", is connected to the second fixed contact $B_1$ when the MSB output $Q_{23}$ of the second shift register 214 is at logic level "1" and is connected to the third fixed contact $C_1$ when both the MSB outputs $Q_{13}$ and $Q_{23}$ are at logic level "0". The second to fourth selection switches 236 to 238, like the first selection switch 235, are switched according to the logic level of the outputs of the shift registers 213 and 214.

Figure 18:
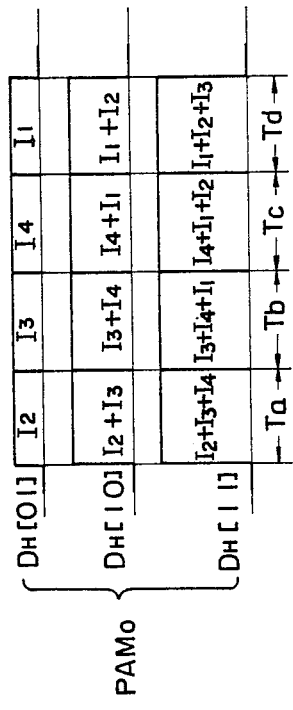
FIG. 18 is a waveform diagram showing the PAM wave obtained through conversion of higher order $n_H$ bit data in the same embodiment.

The four selection switches 235 to 238 successively select the four constant current sources 231 to 234 in numbers corresponding to the higher order $n_H$-bit data $D_H$ consisting of bits $D_0$ and $D_1$ for every time sections Ta, Tb, Tc and Td shown in the time chart of FIG. 17 according to the first control data $S_A$ provided from the first shift register 213, thus forming a PAM wave $PAM_0$ consisting of four PAM pulses as shown in FIG. 18. This PAM wave $PAM_0$ is supplied to the operational amplifier 240.

The four selection switches 235 to 238 selectively connect the four constant current sources 231 to 234 successively to the PWM switch 239 for every individual time sections Ta, Tb, Tc and Td according to the second control data $S_B$ provided from the second shift register 214. The PWM switch 239, which is controlled for switching by the PWM control signal $S_{PWM}$, forms the PWM wave PWM$_0$ consisting of four PWM pulses. The PWM wave PWM$_0$ is supplied to the operational amplifier 240.

Figure 19:
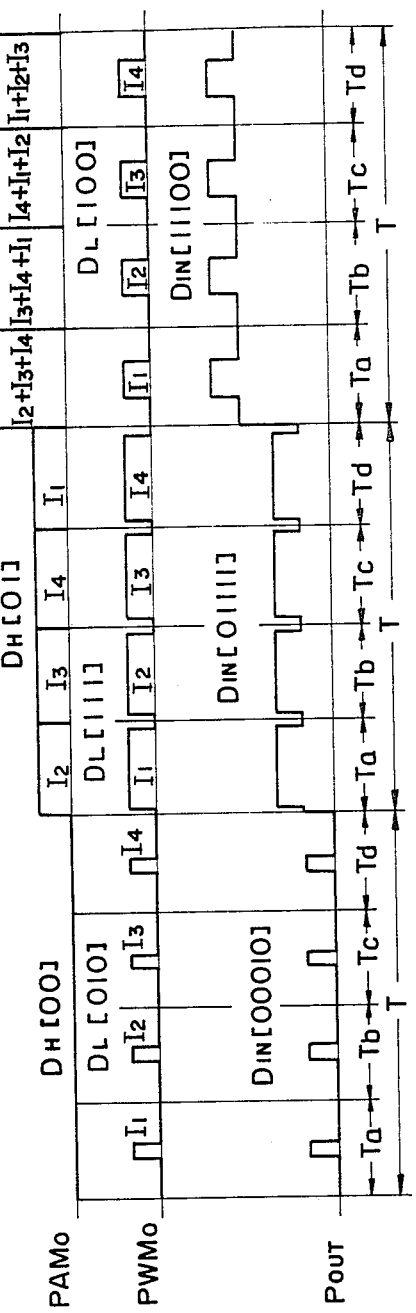
FIG. 19 is a waveform diagram showing an example of resultant pulses obtained through additive combination of PAM and PWM waves in the same embodiment.

The operational amplifier 240 additively combines the PAM and PWM waves PAM$_0$ and PWM$_0$ which are formed a plurality of times in one conversion period T by the switching operation of the switches 235 to 239 to produce resultant pulses P$_{OUT}$ as shown in FIG. 19.

With this embodiment of the above construction, the lower order n$_L$-bit data D$_L$ of the N-bit input digital data is converted to the PWM wave PWM$_0$ consisting of four PWM pulses with the pulse width $\tau$ thereof varying symmetrically with respect to the timings corresponding to the center of the time periods Ta, Tb, Tc and Td as uniform divisions of one conversion period T. Since the PWM wave PWM$_0$ consists of four PWM pulses provided symmetrically with the same pulse width $\tau$ and successively with a uniform delay time in one conversion period T, when it is converted through interpolation by the low-pass filter to the analog signal, the signal level can be increased to an extent corresponding to the number of provided pulses without increasing the distortion factor.

The higher order n$_H$-bit data of the N-bit input digital data is converted to the PAM wave PAM$_0$ timed to the PWM wave PWM$_0$ and consisting of four PAM pulses with pulse width thereof corresponding to the respective time periods Ta, Tb, Tc and Td. The interpulse interval between consequentive pulses of the PAM wave PAM$_0$ may be set to any suitable value but is preferably shorter for reducing the aperture effect.

In this embodiment the PAM and PWM waves PAM$_0$ and PWM$_0$ are formed with successive selection of the constant current sources 231 to 234 in the modulating section 230 in one conversion period T, so that the peak value of the resultant wave may be represented by the average value of the current levels I$_1$ to I$_4$ of the constant current sources 231 to 234. Thus, it is possible to ensure satisfactory linearity of the conversion characteristics of the PWM and PAM waves PWM$_0$ and PAM$_0$ without need of substantial high precision of the constant current sources 231 to 234, thus permitting ready monolithic IC implementation.

Figure 20:
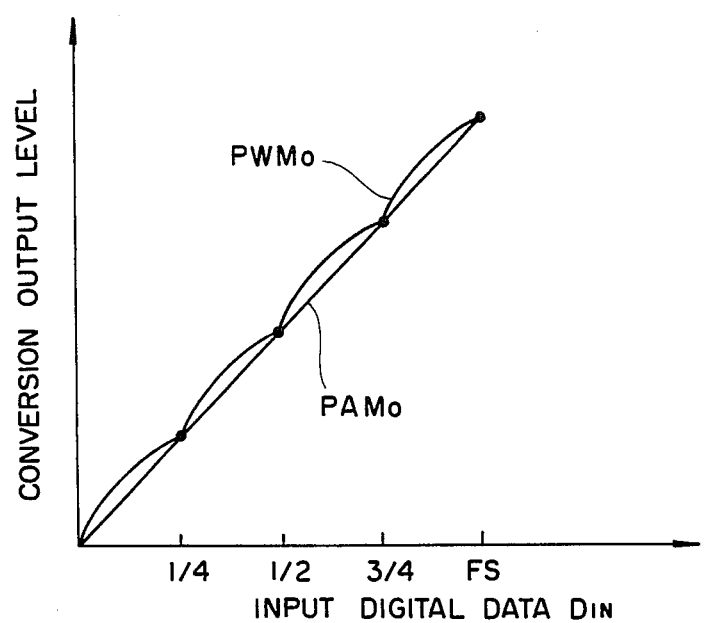
FIG. 20 is a graph showing the D/A conversion characteristic obtained in the same embodiment.

The resultant pulses P$_{OUT}$ obtained through additive combination of the PAM and PWM waves PAM$_0$ and PWM$_0$ have a waveform which is symmetrical with respect to the center t$_\phi$ of the period T, so that no error due to FM components is contained. Thus, the error due to the non-linearity of the conversion characteristic of conversion to the analog signal through interpolation through the low-pass filter is small, as shown in FIG. 20.

Figure 21:
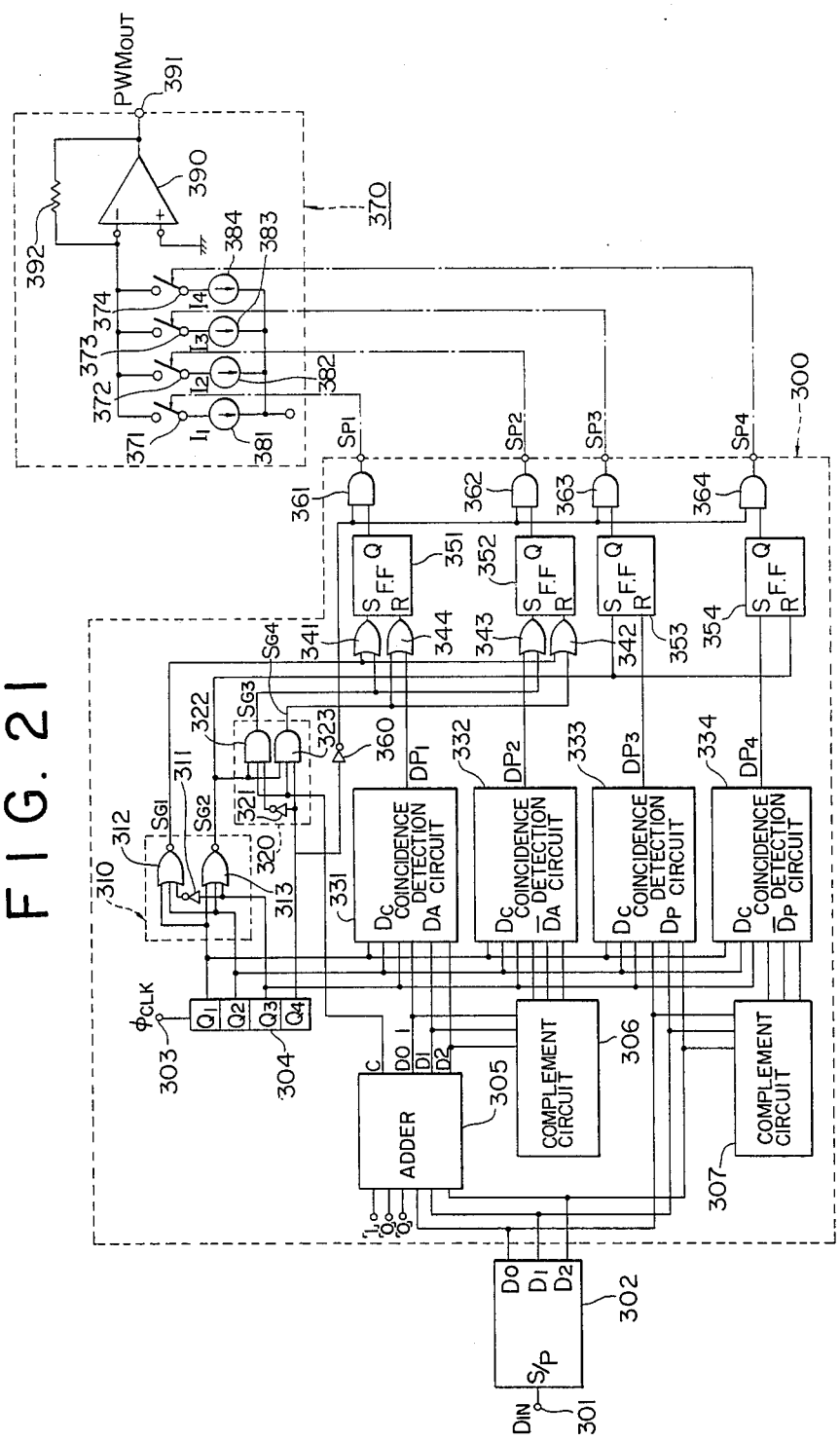
FIG. 21 is a schematic representation of a fourth embodiment of the digital-to-analog converting system according to the present invention.

FIG. 21 is a block diagram showing a fourth embodiment of the present invention. The N-bit serial data D$_{IN}$ which is obtained by quantizing the analog signal for every sampling period T$_S$ is supplied to a data input terminal 301. In this embodiment, the 3-bit serial data D$_{IN}$ consisting of bits D$_0$ to D$_2$ is supplied to the data input terminal 301.

The serial data D$_{IN}$ is supplied the data input terminal 301 to a serial-to-parallel (S/P) converter 302 for conversion to parallel data D$_P$ consisting of bits D$_0$ to D$_2$, which is supplied to the modulation control section 300.

Figure 22:
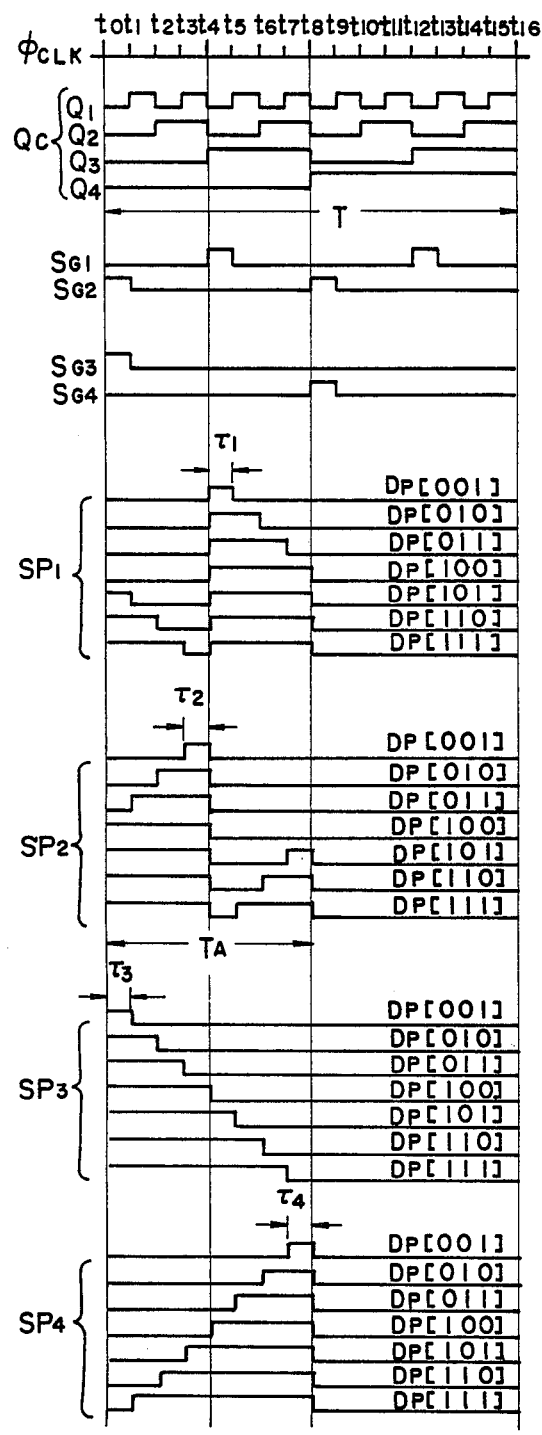
FIG. 22 is a time chart illustrating the operation of the same embodiment.

The modulation control section 300 in this embodiment includes a 4-bit counter 304 for counting clock pulses $\phi_{CLK}$ at frequency f$_{CLK}$ supplied from a clock input terminal 303. By counting clock pulses $\phi_{CLK}$ the counter 304 supplies lower order 3-bit data D$_{CL}$ consisting of bits Q$_3$ to Q$_1$ in 4-bit count output data D$_C$ consisting of bits Q$_3$ to Q$_1$ obtained at every timings t$_0$, t$_1$, . . ., as shown in FIG. 22, to a first gate circuit 310 and also to first to fourth coincidence detection circuits 331 to 334.

The first gate circuit 310 includes an inverter 311 and NOR gates 312 and 313. When the 3-bit data D$_{CL}$ is provided from the counter 304, the NOR gate 312 provides a first gate output signal S$_{G1}$ which is expressed as $$S_{G1}\overline{Q_1+Q_2+Q_3}$$

while the other NOR gate 313 provides a second gate output signal SG$_2$ which is expressed as $$S_{G2}=\overline{Q_1+Q_2+Q_3}$$

The first gate output signal S$_{G1}$ provided from the first gate circuit 310 is supplied through an OR gate 341 to a set input terminal of a first flip-flop 351 and is also supplied through an OR gate 342 to a reset input terminal of a second flip-flop 352. The second gate output signal S$_{G2}$ provided from the first gate circuit 310 is supplied to a second gate circuit 320, and is also supplied to a set input terminal of a third flip-flop 353 and also to a reset input terminal of a fourth flip-flop 354.

The second gate circuit 320 receives the MBS data Q$_4$ from the counter 304 and also carry output data C from an adder 305. It includes an inverter 321 and AND gates 322 and 323. The AND gate 322 provides a third gate output signal S$_{G3}$ which is expressed as $$S_{G3}=S_{G2}\cdot C\cdot \overline{Q_4}$$

while the other AND gate 323 provides a fourth gate output signal S$_{G4}$ which is expressed as $$S_{G4}=S_{G2}\cdot C\cdot Q_4$$

The third gate output signal S$_{G3}$ produced from the second gate circuit 320 is supplied through the OR gate 341 to the set input terminal of the first flip-flop 351 and is also supplied through the OR gate 343 to the set input terminal of the second flip-flop 352. The fourth gate output signal S$_{G4}$ produced from the second gate circuit 320 is supplied through the OR gate 344 to the reset input terminal of the first flip-flop 351 and is also through the OR gate 342 to the reset input terminal of the second flip-flop 352.

The adder 305 adds data "1, 0, 0" to the N-bit (i.e., 3-bit) parallel data D$_P$ consisting of bits D$_0$ to D$_2$ obtained from the S/P converter 302 and supplies the carry output data C to the second gate circuit 320. Also, it supplies the sum output data D$_A$ consisting of bits D$_{0+1}$, D$_1$ and D$_2$ to the first coincidence detection circuit 310 and also to a first complement circuit 306. The first complement circuit 306 produces the complement data $\overline{D_A}$ to the sum output data D$_A$ and supplies the complement data $\overline{D_A}$ to the second coincidence detection circuit 332. The operation o the adder 305 and first complement circuit 306 is illustrated in Table 2 below.

TABLE 2

| Parallel data D$_P$ | | | Carry output C | Sum ouput data D$_A$ | | | Complement data $\overline{D_A}$ | | |
|---|---|---|---|---|---|---|---|---|---|
| 0 | 0 | 1 | 0 | 1 | 0 | 1 | 0 | 1 | 1 |
| 0 | 1 | 0 | 0 | 1 | 1 | 0 | 0 | 1 | 0 |
| 0 | 1 | 1 | 0 | 1 | 1 | 1 | 0 | 0 | 1 |

TABLE 2-continued

| Parallel data $D_p$ | | | Carry output C | Sum ouput data $D_A$ | | | Complement data $\overline{D_A}$ | | |
|---|---|---|---|---|---|---|---|---|---|
| 1 | 0 | 0 | 1 | 0 | 0 | 0 | 0 | 0 | 0 |
| 1 | 0 | 1 | 1 | 0 | 0 | 1 | 1 | 1 | 1 |
| 1 | 1 | 0 | 1 | 0 | 1 | 0 | 1 | 1 | 0 |
| 1 | 1 | 1 | 1 | 0 | 1 | 1 | 1 | 0 | 1 |

The N-bit (i.e., 3-bit) parallel data $D_P$ consisting of bits $D_0$ to $D_2$ obtained from the S/P converter 302 is also supplied to the third coincidence detection circuit and also to a second complement circuit 307. The second complement circuit 307 produces 2's complement data $\overline{D_P}$ to the parallel data $D_P$ consisting of bits $D_0$ to $D_2$, the complement data $\overline{D_P}$ supplied to the fourth coincidence detection circuit 334.

The first coincidence detection circuit 331 compares for coincidence detection the count output data $D_C$ from the counter 304 and sum output data $D_A$ from the adder 305 and supplies the coincidence detection signal $DP_1$ through the OR gate 344 to the reset input terminal of the first flip-flop 351. The second coincidence detection circuit 332 compares the count output data $D_C$ and complement data $\overline{D_A}$ to the first complement circuit 306 and supplies the coincidence detection signal $DP_2$ through the OR gate 343 to the set input terminal of the second flip-flop 352. The third coincidence detection circuit 333 compares the count output data $D_C$ and parallel data $D_P$ of the S/P converter 302 and supplies the coincidence detection signal $DP_3$ to the reset input terminal of the third flip-flop 353. The fourth coincidence detection circuit 334 compares the count output data $D_C$ and complement data $\overline{D_P}$ the second complement circuit 307 and supplies the coincidence detection signal $DP_4$ to the set input terminal of the fourth flip-flop 354.

The first to fourth flip-flops 351 to 354 are triggered at the timing of rising of each of the signals supplied to the set and reset input terminals to provide first to fourth pulse width control signals $S_{P1}$ to $S_{P4}$ through AND gates 361 to 364.

The MSB output $Q_4$ of the counter 304 is supplied as gate control signal through an inverter 360 to the AND gates 361 to 364, so that these AND gates are held enabled only during the first half section $T_A$ of one conversion period T, during which the MSB output $Q_4$ is logic level "0".

As the first flip-flop 351 is set at the timing $t_4$ of rising of the first gate output signal $S_{G1}$ and reset at the timing of rising of the first coincidence detection signal $DP_1$, the pulse width $\tau_1$ of the first pulse width control signal $S_{P1}$ which is provided from the first flip-flop 351 through the AND gate 361 is varied according to the parallel data $D_P$ as shown in FIG. 4.

As the second flip-flop 352 is set at the timing of rising of the second coincidence detection signal $DP_2$ and reset at the timing $t_4$ of rising of the first gate output signal $S_{G1}$, the pulse width $\tau_2$ of the second pulse width control signal $S_{P2}$ which is provided from the second flip-flop 352 through the AND gate 362 is varied symmetrically with the first pulse width control signal $S_{P1}$ with respect to the timing $t_4$. Further, for the third and fourth pulse width control signals $S_{P3}$ and $S_{P4}$, the pulse width $\tau_3$ of the third pulse width control signal $S_{P3}$ is varied successively, from the timing $t_8$ of rising of the second gate output signal $S_{G2}$ through $t_7, t_6, \ldots, t_1$ according to the parallel data $D_P$ as shown in FIG. 22.

The first to fourth pulse width control signals $S_{P1}$ to $S_{P4}$ are supplied to a modulating section 370.

The modulating section 370 includes first to fourth switches 371 to 374, which are controlled for switching by the first to fourth pulse width control signals $S_{P1}$ to $S_{P4}$, first to fourth constant current sources 381 to 384 connected to the respective switches 371 to 374, an operational amplifier 390 with an inversion input terminal thereof connected to the constant current sources 381 to 384 through the respective switches 371 to 374, and a feedback resistor 395 connected between an output terminal 391 and inversion input terminal of the operational amplifier 390. A non-inversion input terminal of the operational amplifier 390 is connected to ground.

The first to fourth switches 371 to 374 are controlled for switching according to the first to fourth pulse width control signals $S_{P1}$ to $S_{P4}$ to form four different PWM waves $PWM_1$ to $PWM_4$ of different pulse width variations according to the parallel data $D_P$. These PWM waves are supplied to the inversion input terminal of the operational amplifier 390.

Figure 23:
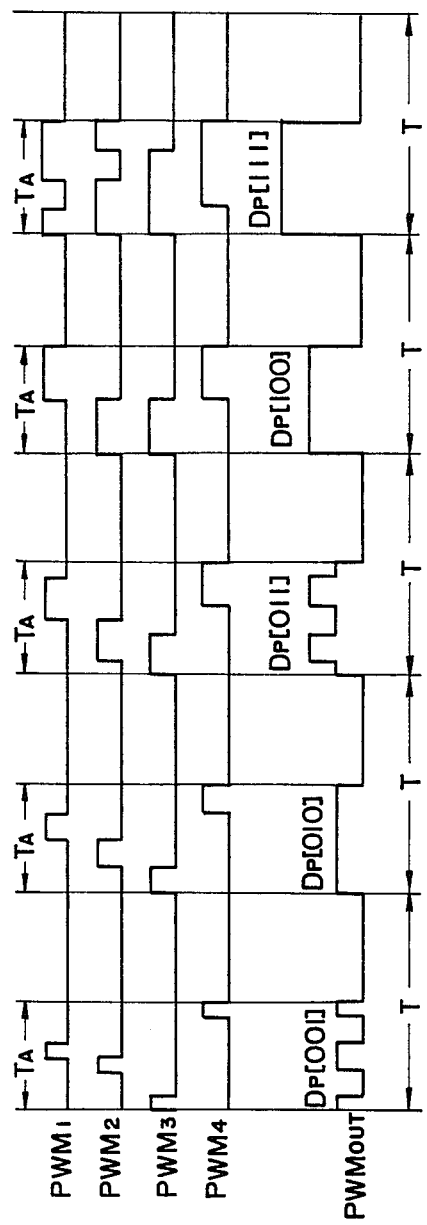
FIG. 23 is a waveform diagram showing the PWM wave obtained from a modulating section in the same embodiment.

The operational amplifier 390 additively combines the PWM waves $PWM_1$ to $PWM_4$ to produce the PWM wave $PWM_{OUT}$ which is symmetrical in one conversion period T, as shown in FIG. 23.

Figure 24:
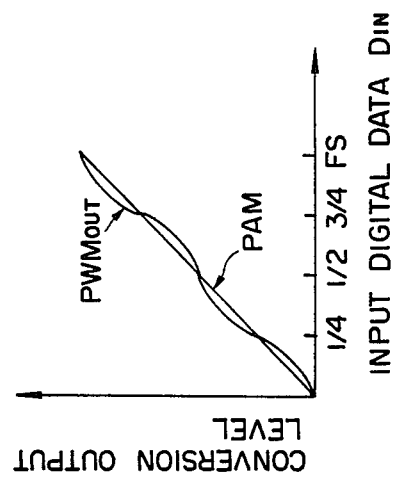
FIG. 24 is a graph showing the D/A conversion characteristic of the same embodiment.

The PWM wave $PWM_{OUT}$ obtained from the modulating section 370 corresponds to a PAM wave, the pulse width of which coincides with the maximum pulse width $\tau_{max}$ in one-fourth FS (full scale), one-half FS, three-fourth FS and FS, and which does not contain any PWM components. Thus, when the PWM wave $PWM_{OUT}$ is converted to the analog signal through interpolation through the low-pass filter, a conversion characteristic which coincides with the conversion characteristic of the PWM wave in the one-fourth FS, one-half FS, three-fourth FS and FS as shown in FIG. 24. The PWM wave $PWM_{OUT}$ is also symmetrical waveform, and its energy is dispersed from the center timing $t_4$ in OFS to one-fourth FS and one-half FS to three-fourth FS and is concentrated in one-fourth FS to one-half FS and three-fourth FS to FS. Thus, a conversion characteristic in which the direction of error due to non-linearity is reversed for every one-fourth FS as shown in FIG. 24 can be obtained. In addition, the practical peak level h of the PWM wave $PWM_{OUT}$ is determined by the average value of the current levels $I_1$ to $I_4$ of the constant current sources 381 to 384, so that satisfactory linearity of the conversion characteristic can be obtained without need of high precision of the constant current sources 381 to 384. Thus, the embodiment is suited for monolithic IC implementation.

While in the above embodiment the linearity of the conversion characteristic can be ensured in one-fourth FS, one-half FS, three-fourth FS and FS through additive combination of the four different PWM waves $PWM_1$ to $PWM_4$ using the four contact current sources 381 to 384, it is possible by using M contact current sources to obtain a resultant PWM wave corresponding to PAM wave for every FS/M.

As has been made apparent from the above embodiments, with the digital-to-analog converting system according to the present invention the N-bit input digital data is divided at least two data, i.e., higher order $n_H$ bits and lower order $n_L$ bits for conversion to respective PAM and PWM waves to be combined together. Thus, the operation frequency of the counter used for the PWM wave pulse width control can be reduced to permit the D/A conversion of high resolution to be performed at a practical operation frequency. In addition, since the individual PWM waves are additively combined in a timed relation to one another in one conversion period, the D/A conversion which is free from errors due to FM components and having excellent linearity, can be performed over a wide dynamic range. Thus, the intended ends of the present invention can be fully attained.

What is claimed is:

1. A digital-to-analog converting system for converting a digital code having higher order bits and lower order bits to an analog value comprising:
    a divider (2) for dividing input digital codes into higher order bits adn lower order bits;
    a PAM controller (3) producing a PAM control signal ($S_{PAM}$) corresponding to said higher order bits for converting said higher order bits to a higher analog value in a first converting style;
    a current source (14, 15, 16) for generating a higher analog value corresponding to said PAM control signals;
    a digital-to-analog converter (4) for converting said lower order bits to a lower analog value in a second converting style using pulse width modulation means, and producing an analog value which is inferior to that produced in the first converting style in linearity, said pulse width modulation means including means for generating pulses having a plurality of different pulse widths and defining a conversion period, means for generating the two's complement of said lower order bits, and means for selecting pulses of different pulse width according to said lower order bits and said two's complement of said lower order bits, and logic means connected to said means for generating pulses and receiving selected pulses of different pulse widths from said means for selecting for producing an output signal formed of two different pulse width modulated waves in which said two pulse width modulated waves are arranged in respective first and second intervals of said conversion period and in which widths of said two pulse width modulated waves pulses vary symmetrically relative to respective central time points of said first and second intervals of said convertion period, thereby to improve linearity; and
    an adder (20) for adding together said higher and lower analog values.

2. A digital-to-analog converting system according to claim 1, wherein said first digital-to-analog converter converts said higher order bits to said higher analog value through Pulse Amplitude Modulation (PAM) providing a pulse level corresponding to said higher order bits.

3. A digital-to-analog converting system according to claim 1, wherein said means for selecting said pulses selects respective pulses in the first and second halves of one sampling period such that distortion due to the pulses selected in said first half of period is complementarily cancelled by the distortion due to pulses selected in said second half of period.

4. A digital-to-analog converting system according to claim 1, wherein said means for selecting said pulses generates pulses of pulse widths corresponding to bits, said pulses being dispersed as a plurality of pulses in one sampling period.

5. A digital-to-analog converting system for converting a digital code having higher order bits to an analog value comprising:
    a divider (2) for dividing input digital codes into higher order bits and lower order bits;
    a PAM controller (3) for producing a PAM control signal ($S_{PAM}$) corresponding to said higher order bits;
    a first current source (14, 15, 16) for generating a higher analog value corresponding to said PAM control signal;
    a PWM controller (4) for producing a PWM control signal ($S_{PWM}$) corresponding to said lower order bits and including a pulse width modulation means further comprising means for generating pulses having a plurality of different pulse widths and defining a conversion period, means for generating the two's complement of said lower order bits, and means for selecting pulses of different pulse width according to said lower order bits and said two's complement of said lower order bits, and logic means receiving selected pulses of different pulse widths from said means for selecting and connected to said means for generating pulses for producing an output signal formed of two different pulse width modulated waves arranged in two respective intervals of said conversion period, in which widths of said pulses in said output signal formed of said two pulse width modulated waves vary symmetrically relative to central time points of respective ones of said two intervals of said conversion period, thereby to improve linearity;
    a second current source (18) for generating a lower analog value corresponding to said PWM control signal; and
    an adder (20) for adding together said higher and lower analog values.

6. A digital-to-analog converting system according to claim 5, wherein said first current source consists of a plurality of current sources corresonding in number to the number of said higher order bits and having respective preset output current levels I, 2I, 4I,..., $2^n$I (I being a reference current level, n being a positive integer).

7. A digital-to-analog converting system according to claim 6, wherein the current level of the minimum current source among said first current sources is equal to the current level of said second current source.

8. A digital-to-analog converting system for converting a digital code having higher order bits, middle order bits and lower order bits to an analog value comprising:
    a divider (25) for dividing input digital codes into higher order bits, middle order bits and lower order bits;
    a first digital-to-analog converter (30) including a PAM controller (3) for producing a PAM control signal ($S_{PAM}$) corresponding to said higher order bits for converting said higher order bits to a higher analog value in a first converting style;
    a current source for generating a higher analog value corresponding to said PAM control signal;
    a second digital-to-analog converter (40A) for converting said middle order bits to a middle analog value in a second converting style which is inferior to the first converting style in linearity;
    a third digital-to-analog converter (40B) for converting said lower order bits to a lower analog value in said second converting style;

an adder (20) for adding together said higher, middle and lower analog values; and said second and third digital-to-analog converters each include a pulse width modulation means, each said pulse width modulation means further including means for generating pulses having a plurality of different pulse widths and defining a conversion period, means for generating the two's complement of said lower order bits, and means for selecting pulses of different pulse width according to said lower order bits and said two's complement of said lower order bits, and each including logic means connected to said means for generating pulses and receiving selected pulses of different pulse widths from said means for selecting for producing an output signal formed of two different pulse width modulated waves in which said two pulse width modulated waves are respectively arranged in two intervals of said conversion period and in which widths of said pulses in said output signal vary symmetrically relative to central time points of said two intervals within said conversion period, thereby to improve linearity.

* * * * *